(12) United States Patent
Forbes et al.

(10) Patent No.: US 7,027,328 B2
(45) Date of Patent: Apr. 11, 2006

(54) INTEGRATED CIRCUIT MEMORY DEVICE AND METHOD

(75) Inventors: Leonard Forbes, Corvallis, OR (US); Jerome M. Eldridge, Los Gatos, CA (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/789,038

(22) Filed: Feb. 27, 2004

(65) Prior Publication Data

US 2004/0164342 A1 Aug. 26, 2004

Related U.S. Application Data

(62) Division of application No. 09/945,498, filed on Aug. 30, 2001, now Pat. No. 6,778,441.

(51) Int. Cl.
*G11C 16/04* (2006.01)
*H01L 21/8238* (2006.01)
*H01L 29/788* (2006.01)

(52) U.S. Cl. ............ 365/185.01; 365/185.28; 365/185.29; 257/135; 257/316; 257/328; 438/201; 438/206; 438/211; 438/212; 438/257

(58) Field of Classification Search ............ 257/315, 257/316, 317; 365/185.01
See application file for complete search history.

(56) References Cited

U.S. PATENT DOCUMENTS

| | | | |
|---|---|---|---|
| 4,295,150 A | 10/1981 | Adam | 357/45 |
| 4,412,902 A | 11/1983 | Michikami et al. | 204/192 |
| 4,688,078 A | 8/1987 | Hseih | 257/321 |
| 4,757,360 A | 7/1988 | Faraone | 357/23.5 |
| 4,780,424 A | 10/1988 | Holler et al. | 437/229 |
| 4,939,559 A | 7/1990 | DiMaria et al. | 257/38 |
| 5,042,011 A | 8/1991 | Casper et al. | 365/205 |
| 5,071,782 A | 12/1991 | Mori | 438/48 |
| 5,073,519 A | 12/1991 | Rodder | 438/269 |
| 5,280,205 A | 1/1994 | Green et al. | 307/530 |
| 5,350,738 A | 9/1994 | Hase et al. | 505/473 |

(Continued)

OTHER PUBLICATIONS

Aarik, Jaan , et al., "Anomalous effect of temperature on atomic layer deposition of titanium oxide", *Journal of Crystal Growth*, (2000),pp. 531-537.

(Continued)

*Primary Examiner*—Huan Hoang
*Assistant Examiner*—Ly Duy Pham
(74) *Attorney, Agent, or Firm*—Schwegman, Lundberg, Woessner & Kluth, P.A.

(57) ABSTRACT

Structures and methods for DEAPROM memory with low tunnel barrier intergate insulators are provided. The DEAPROM memory includes a first source/drain region and a second source/drain region separated by a channel region in a substrate. A floating gate opposes the channel region and is separated therefrom by a gate oxide. A control gate opposes the floating gate. The control gate is separated from the floating gate by a low tunnel barrier intergate insulator having a tunnel barrier of less than 1.5 eV. The low tunnel barrier intergate insulator includes a metal oxide insulator selected from the group consisting of NiO, $Al_2O_3$, $Ta_2O_5$, $TiO_2$, $ZrO_2$, $Nb_2O_5$, $Y_2O_3$, $Gd_2O_3$, $SrBi_2Ta_2O_3$, $SrTiO_3$, $PbTiO_3$, and $PbZrO_3$. The floating gate includes a polysilicon floating gate having a metal layer formed thereon in contact with the low tunnel barrier intergate insulator. And, the control gate includes a polysilicon control gate having a metal layer formed thereon in contact with the low tunnel barrier intergate insulator.

38 Claims, 15 Drawing Sheets

U.S. PATENT DOCUMENTS

| | | | |
|---|---|---|---|
| 5,399,516 A | 3/1995 | Bergendahl et al. ........... 437/43 |
| 5,418,389 A | 5/1995 | Watanabe ................... 257/295 |
| 5,474,947 A | 12/1995 | Chang et al. |
| 5,488,612 A | 1/1996 | Heybruck .................... 714/725 |
| 5,497,494 A | 3/1996 | Combs et al. ............... 395/750 |
| 5,498,558 A | 3/1996 | Kapoor ........................ 437/43 |
| 5,508,544 A | 4/1996 | Shah ........................... 257/316 |
| 5,600,592 A | 2/1997 | Atsumi et al. ......... 365/185.18 |
| 5,618,575 A | 4/1997 | Peter .............................. 427/8 |
| 5,618,761 A | 4/1997 | Eguchi et al. |
| 5,619,051 A | 4/1997 | Endo |
| 5,627,785 A | 5/1997 | Gilliam et al. ......... 365/189.01 |
| 5,677,867 A | 10/1997 | Hazani ........................ 365/185 |
| 5,691,230 A | 11/1997 | Forbes ........................ 437/62 |
| 5,801,401 A | 9/1998 | Forbes ......................... 257/77 |
| 5,852,306 A | 12/1998 | Forbes ....................... 257/315 |
| 5,880,991 A | 3/1999 | Hsu et al. .................... 365/182 |
| 5,923,056 A | 7/1999 | Lee et al. .................... 257/192 |
| 5,936,274 A | 8/1999 | Forbes et al. ............... 257/315 |
| 5,959,465 A | 9/1999 | Beat ............................. 326/39 |
| 5,973,355 A * | 10/1999 | Shirai et al. ................. 257/317 |
| 5,981,350 A | 11/1999 | Geusic et al. ............... 438/386 |
| 5,986,932 A | 11/1999 | Ratnakumar et al. ... 365/185.07 |
| 5,991,225 A | 11/1999 | Forbes et al. .......... 365/230.06 |
| 6,009,011 A | 12/1999 | Yamauchi |
| 6,025,228 A | 2/2000 | Ibok et al. ................... 438/261 |
| 6,025,627 A | 2/2000 | Forbes et al. ............... 257/321 |
| 6,031,263 A | 2/2000 | Forbes et al. ............... 257/315 |
| 6,069,380 A | 5/2000 | Chou et al. .................. 257/315 |
| 6,069,816 A | 5/2000 | Nishimura ................... 365/145 |
| 6,124,729 A | 9/2000 | Noble et al. ................... 326/41 |
| 6,134,175 A | 10/2000 | Forbes et al. .......... 365/230.06 |
| 6,135,175 A | 10/2000 | Gaudreault et al. ........... 144/4.1 |
| 6,141,238 A | 10/2000 | Forbes et al. ............... 365/145 |
| 6,141,248 A | 10/2000 | Forbes et al. .......... 365/185.08 |
| 6,143,636 A | 11/2000 | Forbes et al. ............... 438/587 |
| 6,153,468 A | 11/2000 | Forbes et al. ............... 438/257 |
| 6,163,049 A | 12/2000 | Bui ............................. 257/321 |
| 6,169,306 B1 | 1/2001 | Gardner et al. ............. 267/310 |
| 6,208,164 B1 | 3/2001 | Noble et al. ................... 326/41 |
| 6,210,999 B1 | 4/2001 | Gardner et al. ............. 438/183 |
| 6,229,175 B1 | 5/2001 | Uchida ........................ 257/315 |
| 6,238,976 B1 | 5/2001 | Noble et al. ................. 438/259 |
| 6,246,606 B1 | 6/2001 | Forbes et al. .......... 365/185.03 |
| 6,249,020 B1 | 6/2001 | Forbes et al. ............... 257/315 |
| 6,249,460 B1 | 6/2001 | Forbes et al. .......... 365/185.28 |
| 6,307,775 B1 | 10/2001 | Forbes et al. .......... 365/185.01 |
| 6,317,364 B1 | 11/2001 | Guterman et al. |
| 6,323,844 B1 | 11/2001 | Yeh et al. .................... 345/166 |
| 6,341,084 B1 | 1/2002 | Numata et al. |
| 6,351,411 B1 | 2/2002 | Forbes et al. ............... 365/182 |
| 6,377,070 B1 * | 4/2002 | Forbes ......................... 326/41 |
| 6,424,001 B1 * | 7/2002 | Forbes et al. ............... 257/315 |
| 6,461,931 B1 | 10/2002 | Eldridge ..................... 438/398 |
| 6,514,842 B1 | 2/2003 | Prall et al. ................... 438/593 |
| 6,521,943 B1 * | 2/2003 | Mine et al. .................. 257/317 |
| 6,541,280 B1 | 4/2003 | Kaushik et al. ................. 438/3 |
| 6,586,797 B1 | 7/2003 | Forbes et al. ............... 257/325 |
| 6,730,575 B1 | 5/2004 | Eldridge ..................... 257/310 |
| 6,740,928 B1 | 5/2004 | Yoshii et al. |
| 6,754,108 B1 | 6/2004 | Forbes |
| 6,778,441 B1 | 8/2004 | Forbes et al. |
| 2001/0013621 A1 | 8/2001 | Nakazato ..................... 257/314 |
| 2002/0008324 A1 | 1/2002 | Shinkawata |
| 2002/0106536 A1 | 8/2002 | Lee et al. .................... 428/702 |
| 2002/0109138 A1 * | 8/2002 | Forbes ......................... 257/51 |
| 2002/0137250 A1 | 9/2002 | Nguyen et al. ............... 438/53 |
| 2003/0043637 A1 | 3/2003 | Forbes et al. |
| 2003/0207032 A1 | 11/2003 | Ahn et al. |
| 2003/0207540 A1 | 11/2003 | Ahn et al. |
| 2005/0023595 A1 | 2/2005 | Forbes et al. |
| 2005/0023603 A1 | 2/2005 | Eldridge et al. |
| 2005/0169054 A1 | 8/2005 | Forbes |

OTHER PUBLICATIONS

Aarik, Jaan , et al., "Texture development in nanocrystalline hafnium dioxide thin films grown by atomic layer deposition", *Journal of Crystal Growth, 220(1-2)*, (2000),105-113.

Afanas'ev, V , et al., "Electron energy barriers between (100)Si and ultrathin stacks of SiO2, Al2O3, adn ZrO3 and ZrO2 insulators", *Applied Physics Letters 78(20)*, (2001),pp. 3073-3075.

Arya, S. , et al., "Conduction Properties of Thin Al2O3 Films", *Thin Solid Films, 91*, (1982),363-374.

Dipert, Brian, "Flash Memory Goes Mainstream", *IEEE Spectrum, 30(10)*, (Oct. 1993),48-52.

Eierdal, L. , et al., "Interaction of oxygen with Ni(110) studied by scanning tunnelign microscopy", *Surface Science, 312*, (1994),pp. 31-53.

Eldridge, J. , et al., "Analysis of Ultrathin Oxide Growth on Indium", *Thin Solid Films, 12*, (1972),pp. 447-451.

Eldridge, J. , et al., "Measurement of Tunnel Current Density in a Metal-Oxide-Metal System as a Function of Oxide Thickness", *Proc. 12th Intern. Conf. on Low Temperature Physics*, (1971),427-428.

Eldridge, J.M. , et al., "The Growth of Thin PbO Layers on Lead Films", *Surface Science vol. 40*, (1973),512-530.

Ferguson, J D., et al., "Atomic layer deposition of Al2O3 and SiO2 on BN particles using sequential surface reaction", *Applied Surface Science*, (2000),pp. 280-292.

Greiner, J. , "Josphson Tunneling Barriers by rf Sputter Etching in an Oxygen Plasms", *Journal of Applied Physics, 42(12)*, (Nov. 1971),5151-5155.

Greiner, J. , "Oxidation of lead films by rf sputter etching in an oxygen plasms", *Journal of Applied Physics, 45(1)*, (1974),32-37.

Grimbolt, J. , "I. Interaction of Al Films with O2 at Low Pressures", *Journal of the Electrochemical Society, 129(10)*, (1982),pp. 2366-2368.

Grimbolt, J. , "II. Oxidation of Al Films", *Journal of Electrochem Soc.: Solid-State Science and Technology*, (1982),pp. 2369-2372.

Gundlach, K. , et al., "Logarithmic Conductivity of Al-Al2O3-Al Tunneling Junctions Produced by Plasma and by Thermal Oxidation", *Surface Science, 27*, (1971),125-141.

Guo, X. , "High Quality Ultra-thin (1.5 nm) TiO2/Si3N4 Gate Dielectric for Deep Sub-micron CMOS Technology", *IEDM Technical Digest*, (1999), pp. 137-140.

Hodges, D. A., *Analysis and Design of Digital Integrated Circuits, 2nd Edition*, McGraw-Hill Publishing. New York, (1988),pp. 354-357, 394-396.

Hurych, Z. , "Influence of Non-Uniform Thickness of Dielectric Layers on Capacitance and Tunnel Currents", *Solid-State Electronics, vol. 9*, (1966),967-979.

Itokawa, H , "Determination of Bandgap and Energy Band Aligbnment for High-Dielectric-Constant Gate Insulators Using High-Resolution X-ray Photoelectron Spectroscopy", *Extended Abstracts of the 1999 International Conference on Solid State Devices and Materials*, (1999),pp. 158-159.

Kim, Yong S., et al., "Effect of rapid thermal annealing on the structure and the electrical properties of atomic-layer-deposited Ta2O5 films", *Journal of the Korean Physical Society*, (Dec. 2000),pp. 975-979.

Kim, H., "Leakage current and electrical breakdown in metal-organic chemical vapor deposited TiO2 dielectrics on silicon substrates", *Applied Phys. Lett., 69(25)*, (1996),pp. 3860-3862.

Kim, Yeong K., et al., "Novel capacitor technology for high density stand-alone and embedded DRAMs", *IEDM*, (2000), pp. 369-372.

Kubaschweski, O., et al., *Oxidation of Metals and Alloys, Second Edition*, Butterworths, London, (1962),pp. 1-3, 5,6, 8-12, 24, 36-39, 53-63.

Kukli, Kaupo,. "Atomic Layer Deposition of Titanium Oxide from TiI4 and H2O2", *Chemical Vapor Deposition, 6(6)*,303-310.

Kukli, Kaupo, et al., "Atomic layer deposition of zirconium oxide from zirconium tetraidide, water and hydrogen peroxide", *Journal of Crystal Growth*, (2001),pp. 262-272.

Kukli, K., "Development of Dielectric Properties of Niobium Oxide, Tantalum Oxide, and Aluminum Oxide Based Nanolayered Materials", *Journal of the Electrochemical Society, 148(2)*, (2001),pp. F35-F41.

Kukli, Kaupo, et al., "Real-time monitoring in atomic layer deposition of TiO2 from TiI4and H2O-H2O2", *American Chemical Society*, (2000),pp. 8122-8128.

Kwo, J., "Properties of high k gate dielectrics Gd2O3 and Y2O3 for Si", *Journal of Applied Physics, 89(7)*, (2001),pp. 3920-3927.

Lee, J., et al., "Effect of Polysilicon Gate on the Flatband Voltage Shift and Mobility Degradation for ALD-Al2O3 Gate Dielectric", *IEDM*, (2000),pp. 645-648.

Luan, H. F., "High Quality Ta2O5 Gate Dielectrics wiht Tox,eq<10A", *IEDM Technical Digest. International Electron Devices Meeting*, (Dec. 5-8, 1999),141-143.

Ma, Y., et al., "Zirconium Oxide Based Gate Dielectrics with equivalents Oxide Thickness of LEss Than 1.0 nm and Performance of Submicron MOSFET using a Nitride Gate Replacement Process", *IEDM—Technical Digest*, (1999), pp. 149-152.

Marshalek, R., et al., "Photoresponse Characteristics of Thin-Film Nickel-Nickel Oxide-Nickel Tunneling Junctions", *IEEE Journal of Quantum Electronics, QE-19(4)*, (1983),pp. 743-754.

Masuoka, F., et al., "A 256K Flash EEPROM using Triple Polysilicon Technology", *IEEE International Solid-State Circuits Conference, Digest of Techical Papers*, (1985),168-169.

Masuoak, F., et al., "A New Flash EEPROM Cell Using Triple Polysilicon Technoloyg", *International Electron Devices Metting, Technical Digest*, San Francisco, CA, (1984),464-467.

Mori, S., et al., "Reliable CVD Inter-Poly Dielectrics for Advanced E&EEPROM", *Symposium on VSLI Technology, Digest of Technical Papers*, (1985),16-17.

Muller, H., "Electrical and Optical Properties of Sputtered In2O3 Films", *Physica Status Solidi, 27(2)*, (1968), pp. 723-731.

Paranjpe, Ajit, et al., "Atomic layer deposition AlOx for thin film head gap applications", *Journal of the Electrochemical Society*, (Sep. 2001),pp. 465-471.

Pashley, R., et al., "Flash Memories: the best of two worlds", *IEEE Spectrum 26(1)*, (Dec. 1989), 30-33.

Pollack, S., et al., "Tunneling Through Gaseous Oxidized Films of Al2O3", *Transactions of the Metalurigical Society of AIME, 233*(1965),497-501.

Qi, W., "MOSCAP and MOSFET characteristics using ZrO2 gate dielectric deposited directly on Si", *IEDM—Technical Digest*, (1999),145-148.

Robertson, J., "Band offsets of wide-band-gap oxides and implications for future electronic devices", *Journal of Vacuum Science & Technology B (Microelectronics and Nanometer Structures)*, 18(3), (May-Jun. 2000),1785-1797

Roberston, J., "Schotty barrier heights of tantalum oxide, barium strontium-titanate, lead titanate, and strontium bismuth tantalate", *Applied Physics Letters, 74(8)*, (1999), pp. 1168-1170.

Shi, Y., "Tunneling Leakage Current in Ultrathin (<4 nm) Nitride/Oxide Stack Dielectrics", *IEEE Electron Device Letters, 19(10)*, (Oct. 1998),pp. 388-390.

Simmons, J., "Generalized Formula for the Electric Tunnel Effect between Similar Electrode Separated by a Thin Insulating Film", *Journal of Applied Physics, 34(6)*, (1963), 1793-1803.

Smith, Ryan C., et al., "Chemical vapour deposition of the oxides of titanium, zirconium and hafnium for use as high-k materials in microelectronic devices. A carbon-free precursor for the synthesis if hafnium dioxide", *Advanced Materials for Optics and Electronics*, (2000),pp. 105-106.

Swalin, R., "Equillibrium between Phases of Variable Composition", *Thermodynamics of Solids, 2nd Edition*, (1972),pp. 165-180.

Sze, S., "Physics of Semiconductor Devices, Second Edition", *John Wiley & Sons, New York*, (1981),553-556.

Yan, J., et al., "Structural and electrical characterization of TiO2 grown from titanium tetrakis-isopropoxide (TTIP) and TTIP/H2O ambients", *Journal Vac. Sci. Technol. B, 14(3)*, (1996),pp. 1706-1711.

Zhang, H., et al., "Atomic Layer Deposition of High Dielectric Constant Nanoaminates", *Journal of The Electrochemical Society*, 148(4),(2000),F63-F66.

* cited by examiner

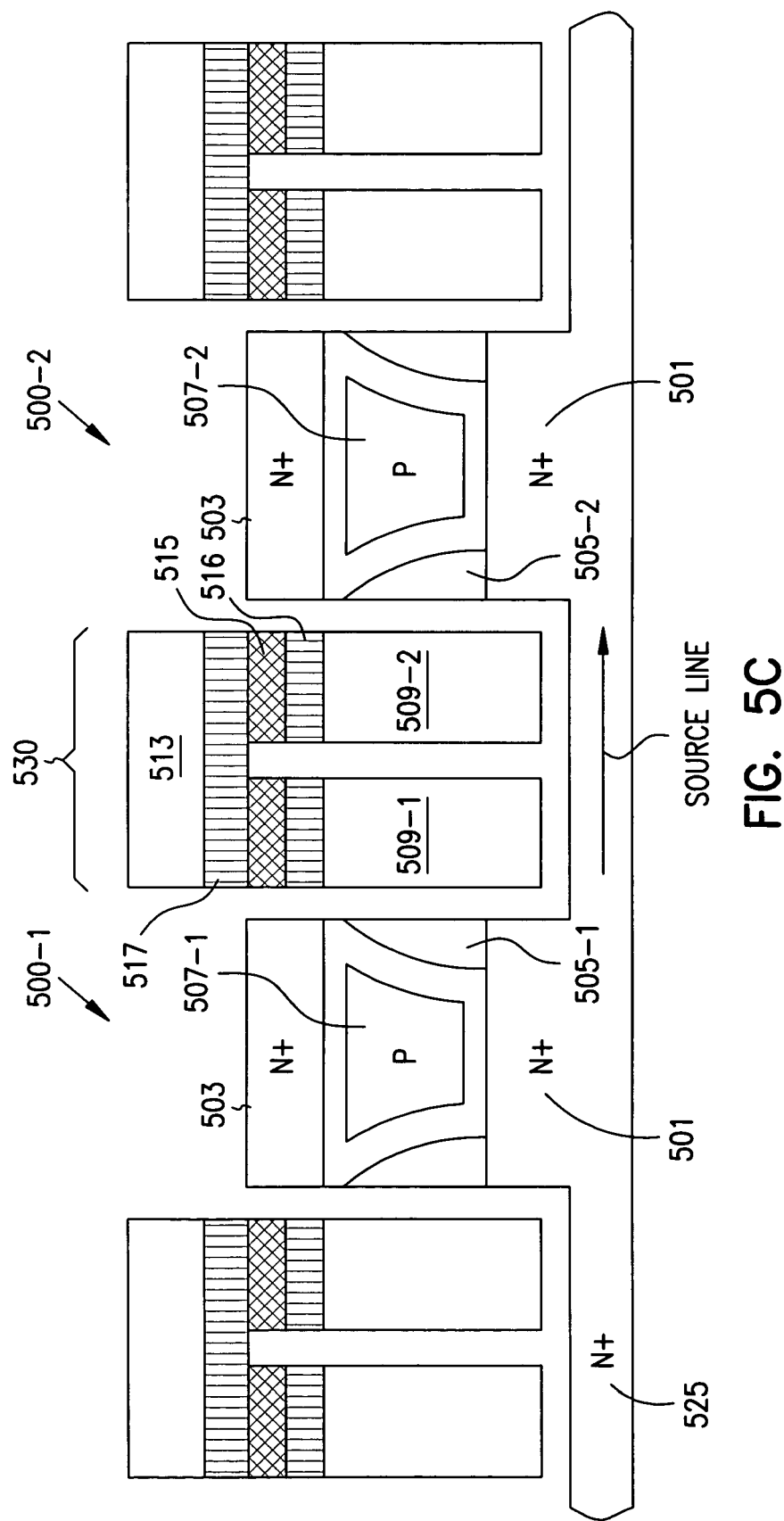

INTEGRATED CIRCUIT MEMORY DEVICE AND METHOD

RELATED APPLICATIONS

This application is a divisional of U.S. application Ser. No. 09/945,498 filed on Aug. 30, 2001, now U.S. Pat. No. 6,778,441 which is incorporated herein by reference.

CROSS REFERENCE TO RELATED APPLICATIONS

This application is related to the following co-pending, commonly assigned U.S. patent applications: "DRAM Cells with Repressed Memory Metal Oxide Tunnel Insulators," Ser. No. 09/945,395, "Programmable Array Logic or Memory Devices with Asymmetrical Tunnel Barriers," Ser. No. 09/943,134, "Flash Memory with Low Tunnel Barrier Interpoly Insulators," Ser. No. 09/945,507, and "Field Programmable Logic Arrays with Metal Oxide and/or Low Tunnel Barrier Interpoly Insulators," Ser. No. 09/945,512, "SRAM Cells with Repressed Floating Gate Memory, Metal Oxide Tunnel Interpoly Insulators," Ser. No. 09/945554, "Programmable Memory Address and Decode Devices with Low Tunnel Barrier Interpoly Insulators," (Micron 01-0485), Ser. No. 09/945,500, which are filed on even date herewith and each of which disclosure is herein incorporated by reference.

FIELD OF THE INVENTION

The present invention relates generally to integrated circuits, and in particular to DEAPROM memory with low tunnel barrier interpoly insulators which require refresh.

BACKGROUND OF THE INVENTION

Flash memories have become widely accepted in a variety of applications ranging from personal computers, to digital cameras and wireless phones. Both INTEL and AMD have separately each produced about one billion integrated circuit chips in this technology.

The original EEPROM or EARPROM and flash memory devices described by Toshiba in 1984 used the interpoly dielectric insulator for erase. (See generally, F. Masuoka et al., "A new flash EEPROM cell using triple polysilicon technology," IEEE Int. Electron Devices Meeting, San Francisco, pp. 464–67, 1984; F. Masuoka et al., "256K flash EEPROM using triple polysilicon technology," IEEE Solid-State Circuits Conf., Philadelphia, pp. 168–169, 1985). Various combinations of silicon oxide and silicon nitride were tried. (See generally, S. Mori et al., "reliable CVD inter-poly dialectics for advanced E&EEPROM," Symp. On VLSI Technology, Kobe, Japan, pp. 16–17, 1985). However, the rough top surface of the polysilicon floating gate resulted in, poor quality interpoly oxides, sharp points, localized high electric fields, premature breakdown and reliability problems.

Widespread use of flash memories did not occur until the introduction of the ETOX cell by INTEL in 1988. (See generally, U.S. Pat. No. 4,780,424, "Process for fabricating electrically alterable floating gate memory devices," 25 Oct. 1988; B. Dipert and L. Hebert, "Flash memory goes mainstream," IEEE Spectrum, pp. 48–51, October, 1993; R. D. Pashley and S. K. Lai, "Flash memories, the best of two worlds," IEEE Spectrum, pp. 30–33, December 1989). This extremely simple cell and device structure resulted in high densities, high yield in production and low cost. This enabled the widespread use and application of flash memories anywhere a non-volatile memory function is required. However, in order to enable a reasonable write speed the ETOX cell uses channel hot electron injection, the erase operation which can be slower is achieved by Fowler-Nordhiem tunneling from the floating gate to the source. The large barriers to electron tunneling or hot electron injection presented by the silicon oxide-silicon interface, 3.2 eV, result in slow write and erase speeds even at very high electric fields. The combination of very high electric fields and damage by hot electron collisions in the oxide result in a number of operational problems like soft erase error, reliability problems of premature oxide breakdown and a limited number of cycles of write and erase.

Other approaches to resolve the above described problems include; the use of different floating gate materials, e.g. SiC, SiOC, GaN, and GaAIN, which exhibit a lower work function (see FIG. 1A), the use of structured surfaces which increase the localized electric fields (see FIG. 1B), and amorphous SiC gate insulators with larger electron affinity, $\chi$, to increase the tunneling probability and reduce erase time (see FIG. 1C).

One example of the use of different floating gate (FIG. 1A) materials is provided in U.S. Pat. No. 5,801,401 by L. Forbes, entitled "FLASH MEMORY WITH MICROCRYSTALLINE SILICON CARBIDE AS THE FLOATING GATE STRUCTURE." Another example is provided in U.S. Pat. No. 5,852,306 by L. Forbes, entitled "FLASH MEMORY WITH NANOCRYSTALLINE SILICON FILM AS THE FLOATING GATE." Still further examples of this approach are provided in pending applications by L. Forbes and K. Ahn, entitled "DYNAMIC RANDOM ACCESS MEMORY OPERATION OF A FLASH MEMORY DEVICE WITH CHARGE STORAGE ON A LOW ELECTRON AFFINITY GaN OR GaAIN FLOATING GATE," Ser. No. 08/908,098, and "VARIABLE ELECTRON AFFINITY DIAMOND-LIKE COMPOUNDS FOR GATES IN SILICON CMOS MEMORIES AND IMAGING DEVICES," Ser. No. 08/903,452.

An example of the use of the structured surface approach (FIG. 1B) is provided in U.S. Pat. No. 5,981,350 by J. Geusic, L. Forbes, and K. Y. Ahn, entitled "DRAM CELLS WITH A STRUCTURE SURFACE USING A SELF STRUCTURED MASK." Another example is provided in U.S. Pat. No. 6,025,627 by L. Forbes and J. Geusic, entitled "ATOMIC LAYER EXPITAXY GATE INSULATORS AND TEXTURED SURFACES FOR LOW VOLTAGE FLASH MEMORIES."

Finally, an example of the use of amorphous SiC gate insulators (FIG. 1C) is provided in U.S. patent application Ser. No. 08/903,453 by L. Forbes and K. Ahn, entitled "GATE INSULATOR FOR SILICON INTEGRATED CIRCUIT TECHNOLOGY BY THE CARBURIZATION OF SILICON."

Additionally, graded composition insulators to increase the tunneling probability and reduce erase time have been described by the same inventors. (See, L. Forbes and J. M. Eldridge, "GRADED COMPOSITION GATE INSULATORS TO REDUCE TUNNELING BARRIERS IN FLASH MEMORY DEVICES," application Ser. No. 09/945,514.

The authors of the present invention have also previously described the concept of a programmable read only memory which requires refresh or is volatile as a consequence of leakage currents though gate dielectrics with a low tunnel barrier between a floating gate and the silicon substrate/well, transistor source, drain, and body regions. (See generally, L.

Forbes, J. Geusic and K. Ahn, "DEAPROM (Dynamic Electrically Alterable Programmable Read Only Memory) UTILIZING INSULATING AND AMORPHOUS SILICON CARBIDE GATE INSULATOR," application Ser. No. 08/902,843). An application relating to leakage currents through an ultrathin gate oxide has also been provided. (See generally, L. Forbes, E. H. Cloud, J. E. Geusic, P. A. Farrar, K. Y. Ahn, and A. R. Reinberg; and D. J. McElroy, and L. C. Tran, "DYNAMIC FLASH MEMORY CELLS WITH ULTRATHIN TUNNEL OXIDES," U.S. Pat. No. 6,249,460).

However, all of these approaches relate to increasing tunneling between the floating gate and the substrate such as is employed in a conventional ETOX device and do not involve tunneling between the control gate and floating gate through an inter-poly dielectric.

Therefore, there is a need in the art to provide improved DEAPROM cells which increase memory densities while avoiding the large barriers to electron tunneling or hot electron injection presented by the silicon oxide-silicon interface, 3.2 eV, which result in slow write and erase speeds even at very high electric fields. There is also a need to avoid the combination of very high electric fields and damage by hot electron collisions in the which oxide result in a number of operational problems like soft erase error, reliability problems of premature oxide breakdown and a limited number of cycles of write and erase. Further, when using an interpoly dielectric insulator erase approach, the above mentioned problems of having a rough top surface on the polysilicon floating gate which results in, poor quality interpoly oxides, sharp points, localized high electric fields, premature breakdown and reliability problems must be avoided.

SUMMARY OF THE INVENTION

The above mentioned problems with DEAPROM memories and other problems are addressed by the present invention and will be understood by reading and studying the following specification. Systems and methods are provided for DEAPROM memories with metal oxide and/or low tunnel barrier interpoly insulators which require refresh. That is, the present invention describes the use of an ultra-thin metal oxide inter-poly dielectric insulators between the control gate and the floating gate to create a memory cell which has a high current gain, and is easy to program by tunneling but which requires refresh. The low barrier tunnel insulator between the floating gate and control gates makes erase of the cell easy but results in the requirement for refresh. These devices act like DRAM's and can be utilized as DRAM replacements. A coincident address is achieved by addressing both the control gate address lines (y-address) and source address lines (x-address).

In one embodiment of the present invention, the DEAPROM memory includes a first source/drain region and a second source/drain region separated by a channel region in a substrate. A floating gate opposing the channel region and is separated therefrom by a gate oxide. A control gate opposes the floating gate. The control gate is separated from the floating gate by a low tunnel barrier intergate insulator having a tunnel barrier of less than 1.5 eV. The low tunnel barrier intergate insulator includes a metal oxide insulator selected from the group consisting of NiO, $Al_2O_3$, $Ta_2O_5$, $TiO_2$, $ZrO_2$, $Nb_2O_5$, $Y_2O_3$, $Gd_2O_3$, $SrBi_2Ta_2O_3$, $SrTiO_3$, $PbTiO_3$, and $PbZrO_3$. The floating gate includes a polysilicon floating gate having a metal layer formed thereon in contact with the low tunnel barrier intergate insulator. And, the control gate includes a polysilicon control gate having a metal layer formed thereon in contact with the low tunnel barrier intergate insulator.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

FIGS. 5A–5E are cross sectional views taken along cut line 5—5 from FIG. 4 illustrating a number of floating gate and control gate configurations which are included in the scope of the present invention.

DESCRIPTION OF THE PREFERRED EMBODIMENTS

In the following detailed description of the invention, reference is made to the accompanying drawings which form a part hereof, and in which is shown, by way of illustration, specific embodiments in which the invention may be practiced. The embodiments are intended to describe aspects of the invention in sufficient detail to enable those skilled in the art to practice the invention. Other embodiments may be utilized and changes may be made without departing from the scope of the present invention. In the following description, the terms wafer and substrate are interchangeably used to refer generally to any structure on which integrated circuits are formed, and also to such structures during various stages of integrated circuit fabrication. Both terms include doped and undoped semiconductors, epitaxial layers of a semiconductor on a supporting semiconductor or insulating material, combinations of such layers, as well as other such structures that are known in the art.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on", "side" (as in "sidewall"), "higher", "lower", "over" and "under" are defined with respect to the conventional plane or surface being on the top surface of the wafer or substrate, regardless of the orientation of the wafer or substrate. The following detailed description is, therefore, not to be taken in a limiting sense, and the scope of the present invention is defined only by the appended claims, along with the full scope of equivalents to which such claims are entitled.

Figure 1A:
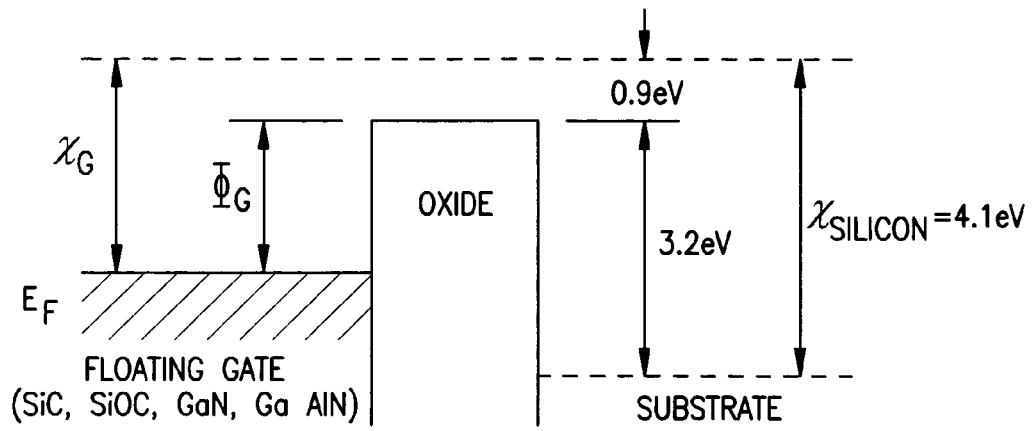
FIGS. 1A–1C illustrate a number of previous methods for reducing tunneling barriers in DEAPROM memory.
Figure 1B:
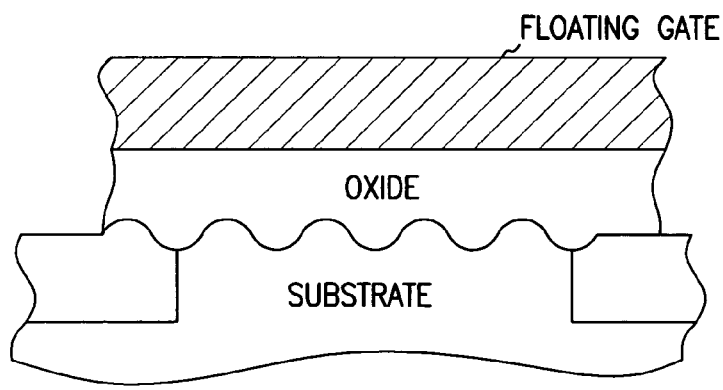
Figure 1C:
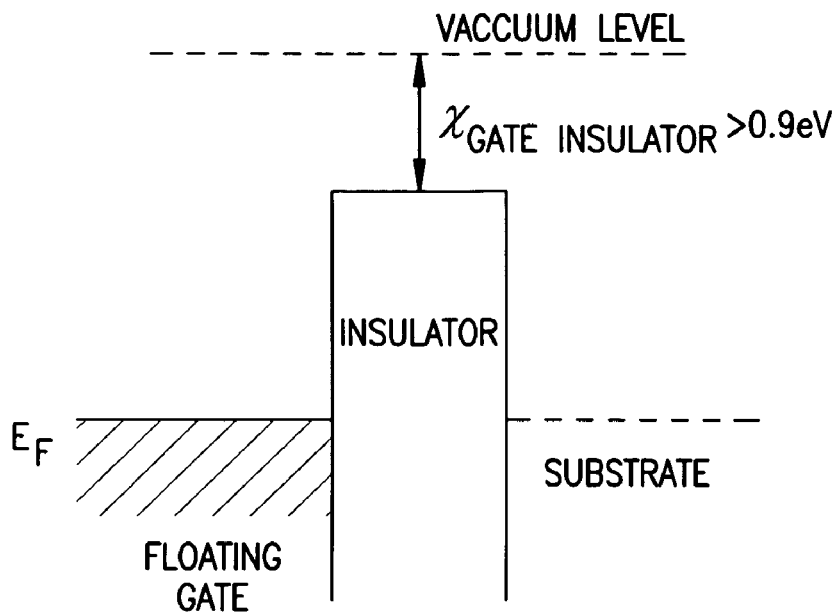
Figure 2:
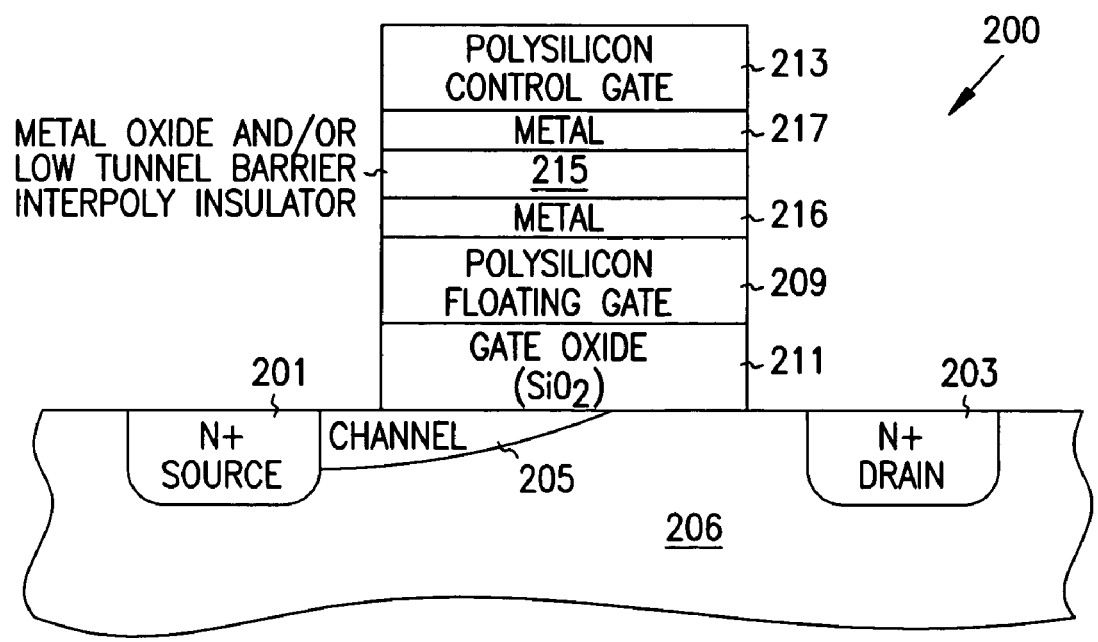
FIG. 2 illustrates one embodiment of a floating gate transistor, or DEAPROM memory cell, according to the teachings of the present invention.
Figure 6A:
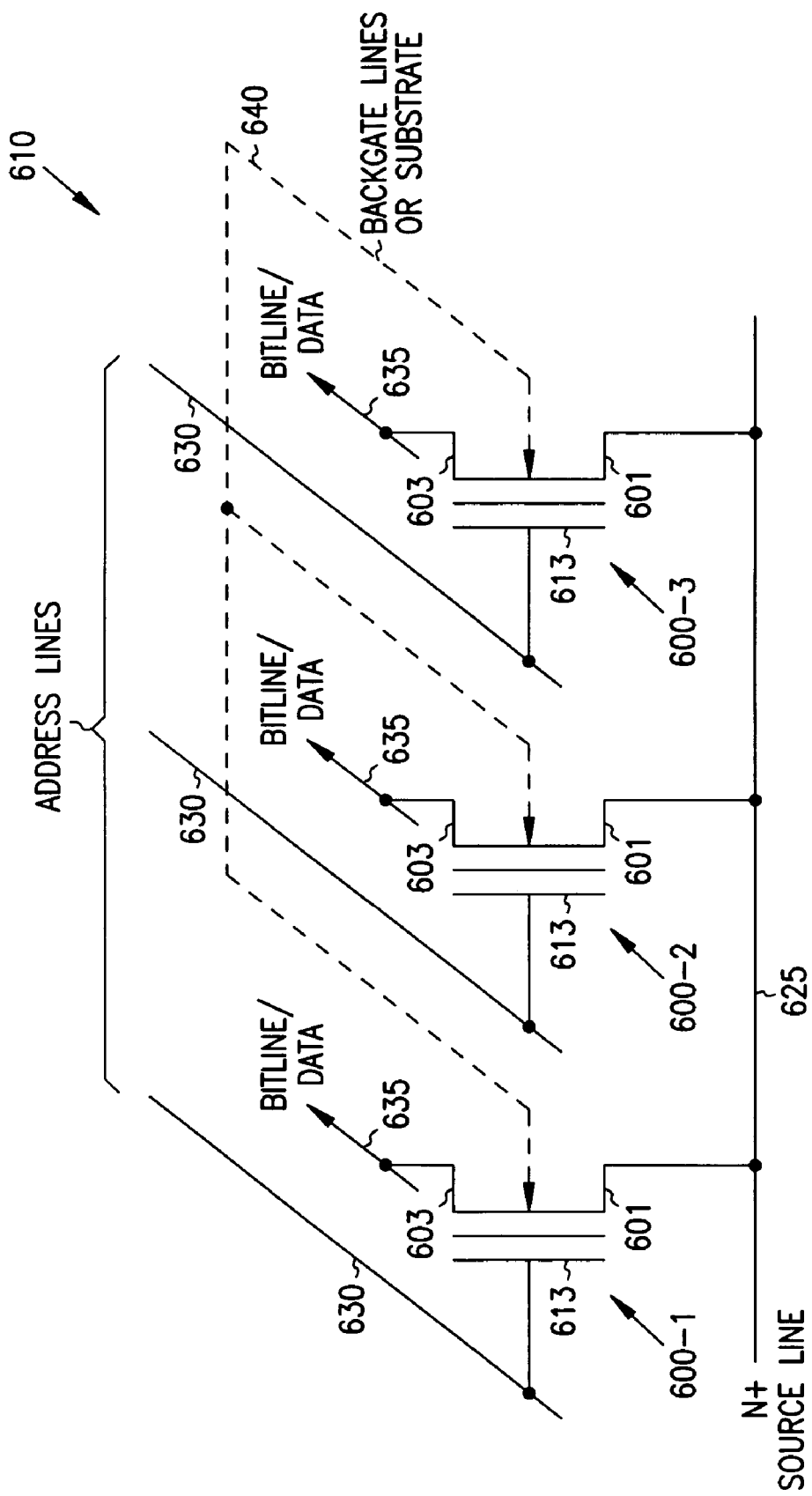
FIGS. 6A–6D illustrate a number of address coincidence schemes can be used together with the present invention.

The present invention describes the use of an ultra-thin metal oxide inter-poly dielectric insulators having a tunnel barrier of less than 1.5 eV between the control gate and the floating gate. As shown in FIG. 2, the ultra-thin metal oxide inter-poly dielectric insulators having a tunnel barrier of less than 1.5 eV are used to create a memory cell which has a high current gain, and is easy to program by tunneling but which requires refresh. The low barrier tunnel insulator between the floating gate and control gates makes erase of the cell easy but results in the requirement for refresh. One possible array structure is shown in FIG. 6A, described in more detail below. These devices of the present invention act like DRAM's and can be utilized as DRAM replacements. In brief, FIG. 6A illustrates that a coincident address is achieved by addressing both the control gate address lines (y-address) and source address lines (x-address).

Figure 7A:
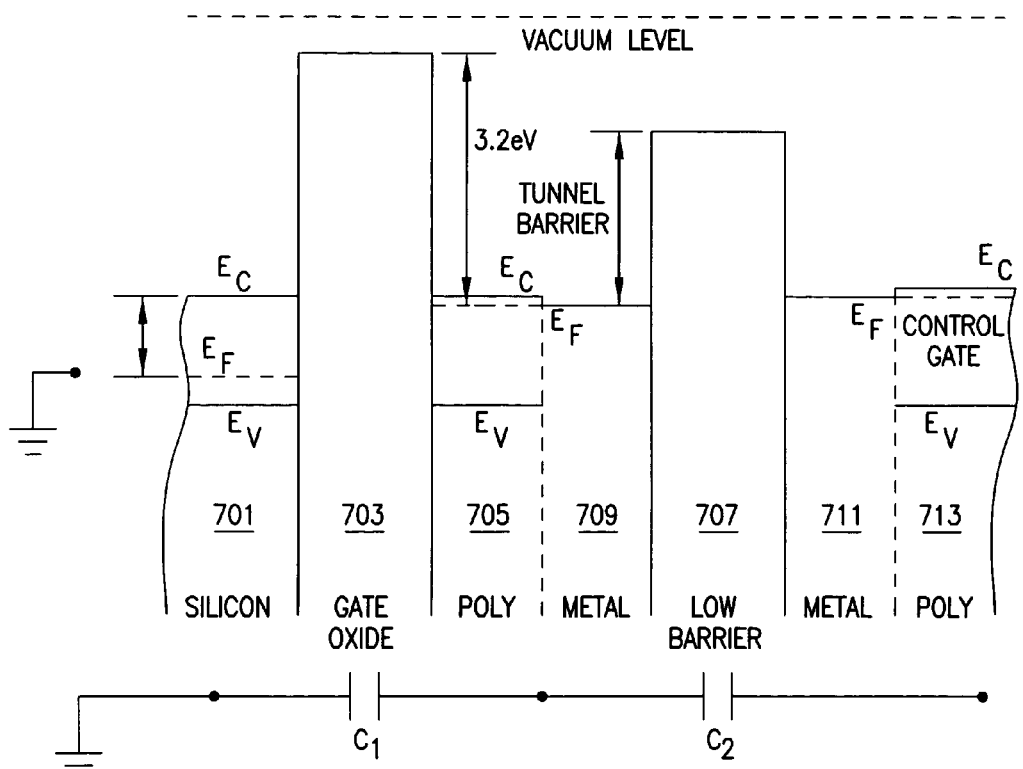
FIG. 7A is an energy band diagram illustrating the band structure at vacuum level with the low tunnel barrier interpoly insulator according to the teachings of the present invention.

Also, as described in more detail below, FIG. 7A shows the conventional silicon oxide gate insulator with a high barrier and then the low tunnel barrier interpoly or intergate insulator between the floating gate and the control gate, as according to the present invention. According to the teachings of the present invention, if the interpoly dielectric is thin enough, e.g. less than 20 Angstroms, or the barrier is low enough, e.g. less than 1.5 eV, to allow a very easy erase then there will be some finite leakage current when the device is addressed for read operations and/or is in a standby state. This will require refresh of the memory state. The tunneling current in erasing charge from the floating gate by tunneling to the control gate will then be as shown and described below in FIG. 7C given by an equation of the form:

$$J = B \exp(-E_o/E)$$

where E is the electric field across the interpoly dielectric insulator 707 and Eo depends on the barrier height. Aluminum oxide has a current density of 1 A/cm² at a field of about $E = 1V/20 \text{ Å} = 5 \times 10^{+6}$ V/cm. Silicon oxide transistor gate insulators have a current density of 1 A/cm² at a field of about $E = 2.3V/23\text{Å} = 1 \times 10^{+7}$ V/cm. The lower electric field in the aluminum oxide interpoly insulator for the same current density reflects the lower tunneling barrier of less than 2.0 eV as opposed to the 3.2 eV tunneling barrier of silicon oxide.

Figure 7B:
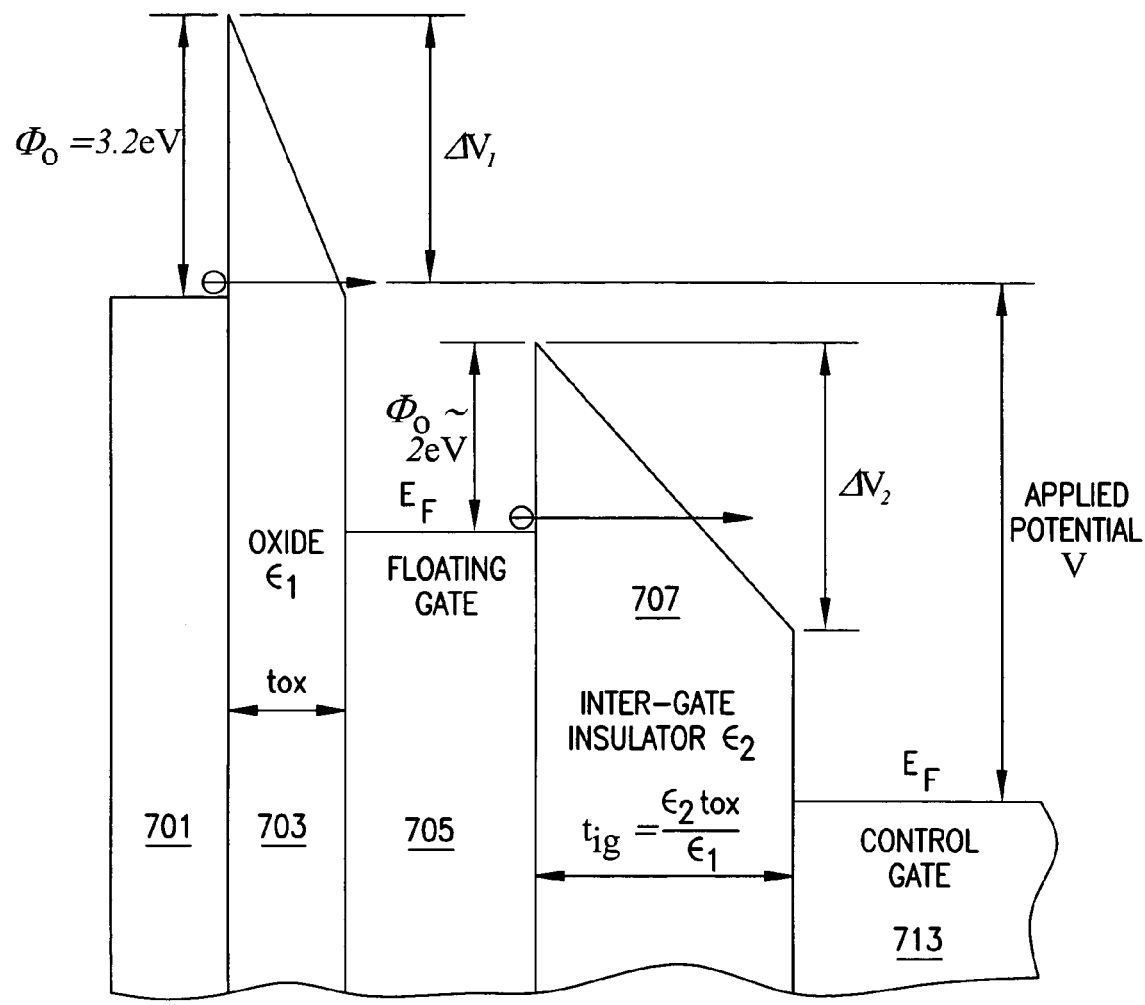
FIG. 7B is an energy band diagram illustrating the band structure during an erase operation of electrons from the floating gate to the control gate across the low tunnel barrier interpoly insulator according to the teachings of the present invention.
Figure 7C:
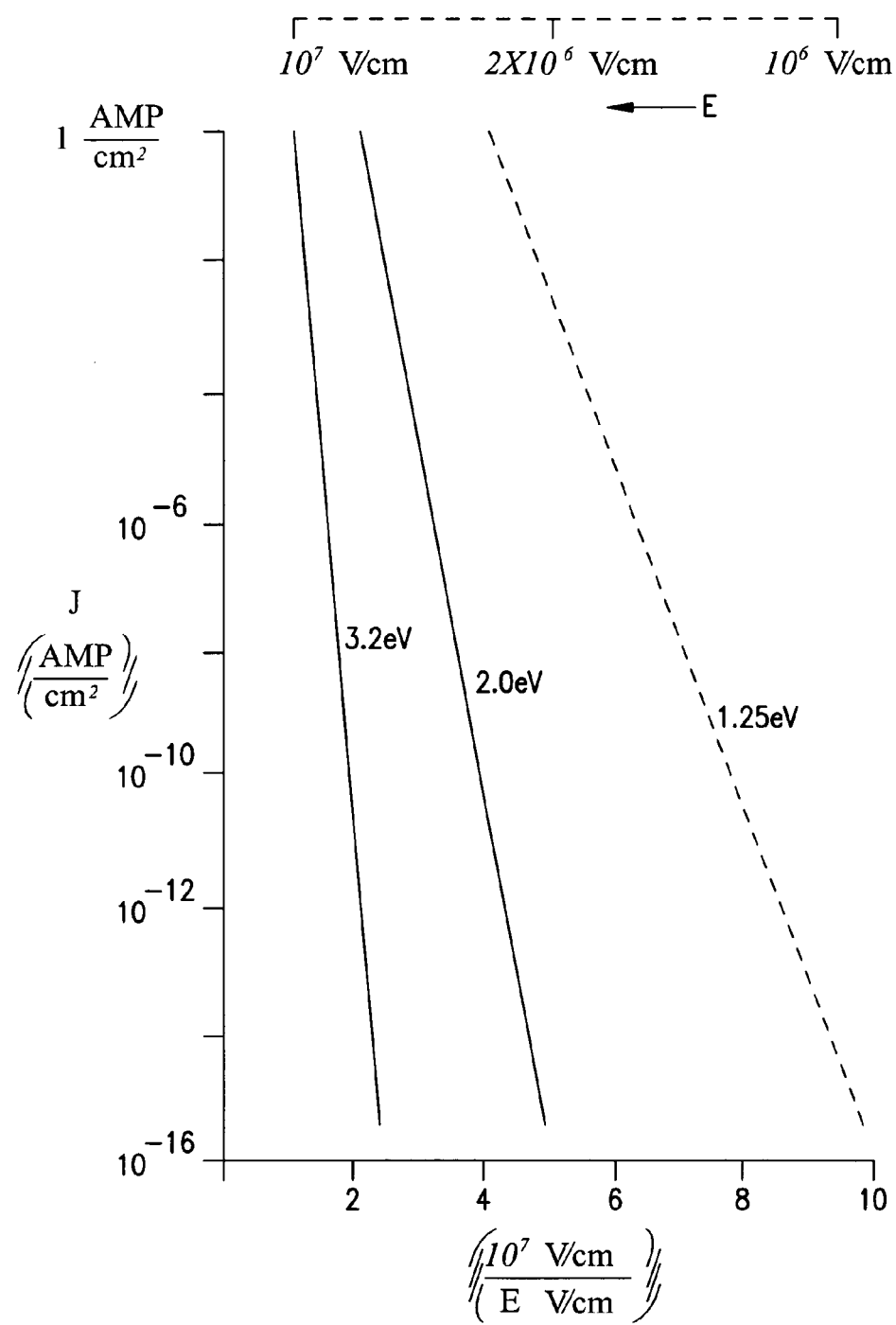
FIG. 7C is a graph plotting tunneling currents versus the applied electric fields (reciprocal applied electric field shown) for an number of barrier heights.

FIG. 7C, discussed below, illustrates the dependence of the tunneling currents on electric field (reciprocal electric field) and barrier height. Low barriers will result in high current densities at low electric fields during write and erase, however, they will also conduct some small but significant current during the electric fields employed for read and as a consequence the data must be refreshed. These memory devices work on a dynamic basis.

As stated above, the present invention describes the use of metal oxide inter-poly dielectric insulators between the control gate and the floating gate. An example is shown in FIG. 2 for a planar structure, or horizontal DEAPROM memory cell. According to the teachings of the present invention. The use of metal oxide films for this purpose offer a number of advantages including:

(i) Flexibility in selecting a range of smooth metal film surfaces and compositions that can be oxidized to form tunnel barrier insulators.

(ii) Employing simple "low temperature oxidation" to produce oxide films of highly controlled thickness, composition, purity and uniformity.

(iii) Avoiding inadvertent inter-diffusion of the metal and silicon as well as silicide formation since the oxidation can be carried out at such low temperatures.

(iv) Using metal oxides that provide desirably lower tunnel barriers, relative to barriers currently used such as $SiO_2$.

(v) Providing a wide range of higher dielectric constant oxide films with improved capacitance characteristics.

(vi) Providing a unique ability to precisely tailor tunnel oxide barrier properties for various device designs and applications.

(vii) Permitting the use of thicker tunnel barriers, if needed, to enhance device performance and its control along with yield and reliability.

(viii) Developing layered oxide tunnel barriers by oxidizing layered metal film compositions in order, for example, to enhance device yields and reliability more typical of single insulating layers.

(ix) Eliminating soft erase errors caused by the current technique of tunnel erase from floating gate to the source.

FIG. 2 illustrates one embodiment of a floating gate transistor, or DEAPROM memory cell 200, according to the teachings of the present invention. As shown in FIG. 2, the DEAPROM memory cell 200 includes a first source/drain region 201 and a second source/drain region 203 separated by a channel region 205 in a substrate 206. A floating gate 209 opposes the channel region 205 and is separated therefrom by a gate oxide 211. A control gate 213 opposes the floating gate 209. According to the teachings of the present invention, the control gate 213 is separated from the floating gate 209 by a low tunnel barrier intergate insulator 215 having a tunnel barrier height of less than 1.5 eV, and which requires refresh.

In one embodiment of the present invention, low tunnel barrier intergate insulator 215 includes a metal oxide insulator selected from the group consisting of nickle oxide (NiO) and aluminum oxide ($Al_2O_3$) and having a thickness of less than 20 Angstroms. In an alternative embodiment of the present invention, the low tunnel barrier intergate insulator 215 includes a transition metal oxide and the transition metal oxide is selected from the group consisting of $Ta_2O_5$, $TiO_2$, $ZrO_2$, $Nb_2O_5$, $Y_2O_3$, and $Gd_2O_3$ having a tunnel barrier of less than 1.5 eV. In still another alternative embodiment of the present invention, the low tunnel barrier intergate insulator 215 includes a Perovskite oxide tunnel barrier selected from the group consisting of $SrBi_2Ta_2O_3$, $SrTiO_3$, $PbTiO_3$, and $PbZrO_3$ having a tunnel barrier of less than 1.5 eV.

According to the teachings of the present invention, the floating gate 209 includes a polysilicon floating gate 209 having a metal layer 216 formed thereon in contact with the low tunnel barrier intergate insulator 215. Likewise, the control gate 213 includes a polysilicon control gate 213 having a metal layer 217 formed thereon in contact with the low tunnel barrier intergate insulator 215. In one embodiment, the metal layers 216 and 217, are formed of platinum (Pt). In an alternative embodiment, the metal layers 216 and 217, are formed of aluminum (Al).

Figure 3:
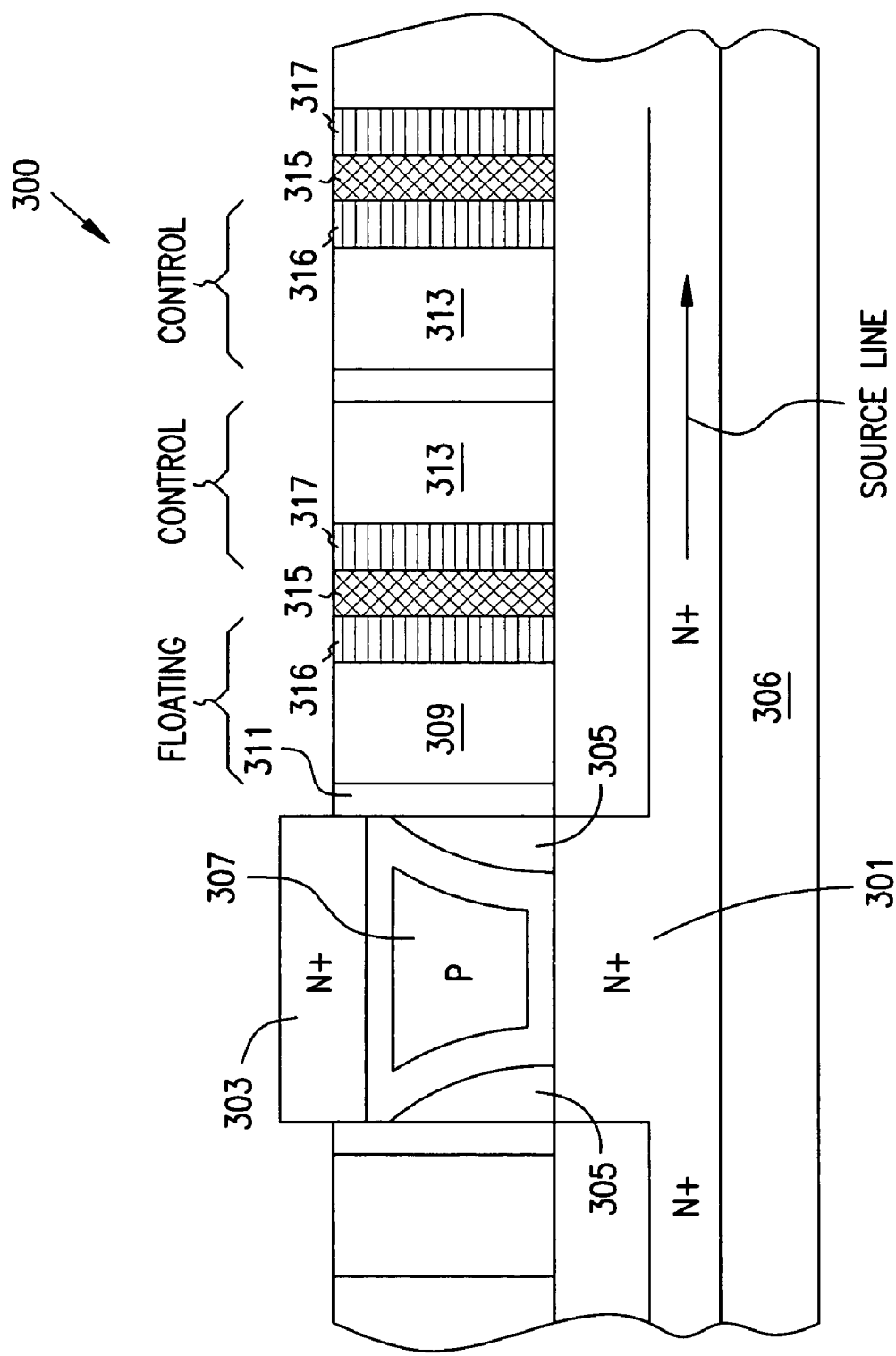
FIG. 3 illustrates another embodiment of a floating gate transistor, or DEAPROM memory cell, according to the teachings of the present invention.

FIG. 3 illustrates another embodiment of a floating gate transistor, or DEAPROM memory cell 300, according to the teachings of the present invention. As shown in the embodiment of FIG. 3, the DEAPROM memory cell 300 includes a vertical non volatile memory cell 300. In this embodiment, the DEAPROM memory cell 300 has a first source/drain region 301 formed on a substrate 306. A body region 307 including a channel region 305 is formed on the first source/drain region 301. A second source/drain region 303 is formed on the body region 307. A floating gate 309 opposes the channel region 305 and is separated therefrom by a gate oxide 311. A control gate 313 opposes the floating gate 309. According to the teachings of the present invention, the control gate 313 is separated from the floating gate 309 by a low tunnel barrier intergate insulator 315 having a tunnel barrier height of less than 1.5 eV, and which requires refresh.

In one embodiment of the present invention, low tunnel barrier intergate insulator 315 includes a metal oxide insulator selected from the group consisting of nickle oxide (NiO) and aluminum oxide ($Al_2O_3$) and having a thickness of less than 20 Angstroms. In an alternative embodiment of the present invention, the low tunnel barrier intergate insulator 315 includes a transition metal oxide and the transition metal oxide is selected from the group consisting of $Ta_2O_5$, $TiO_2$, $ZrO_2$, $Nb_2O_5$, $Y_2O_3$, and $Gd_2O_3$ having a tunnel barrier of less than 1.5 eV. In still another alternative embodiment of the present invention, the low tunnel barrier intergate insulator 315 includes a Perovskite oxide tunnel barrier selected from the group consisting of $SrBi_2Ta_2O_3$, $SrTiO_3$, $PbTiO_3$, and $PbZrO_3$ having a tunnel barrier of less than 1.5 eV.

According to the teachings of the present invention, the floating gate 309 includes a polysilicon floating gate 309 having a metal layer 316 formed thereon in contact with the low tunnel barrier intergate insulator 315. Likewise, the control gate 313 includes a polysilicon control gate 313 having a metal layer 317 formed thereon in contact with the low tunnel barrier intergate insulator 315. In one embodiment, the metal layers 316 and 317, are formed of platinum (Pt). In an alternative embodiment, the metal layers 316 and 317, are formed of aluminum (Al).

As shown in FIG. 3, the floating gate 309 includes a vertical floating gate 309 formed alongside of the body region 307. In the embodiment shown in FIG. 3, the control gate 313 includes a vertical control gate 313 formed alongside of the vertical floating gate 309.

As will be explained in more detail below, the floating gate 309 and control gate 313 orientation shown in FIG. 3 is just one embodiment for a vertical non volatile memory cell 300, according to the teachings of the present invention. In other embodiments, explained below, the floating gate includes a horizontally oriented floating gate formed alongside of the body region. In this alternative embodiment, the control gate includes a horizontally oriented control gate formed above the horizontally oriented floating gate.

Figure 4:
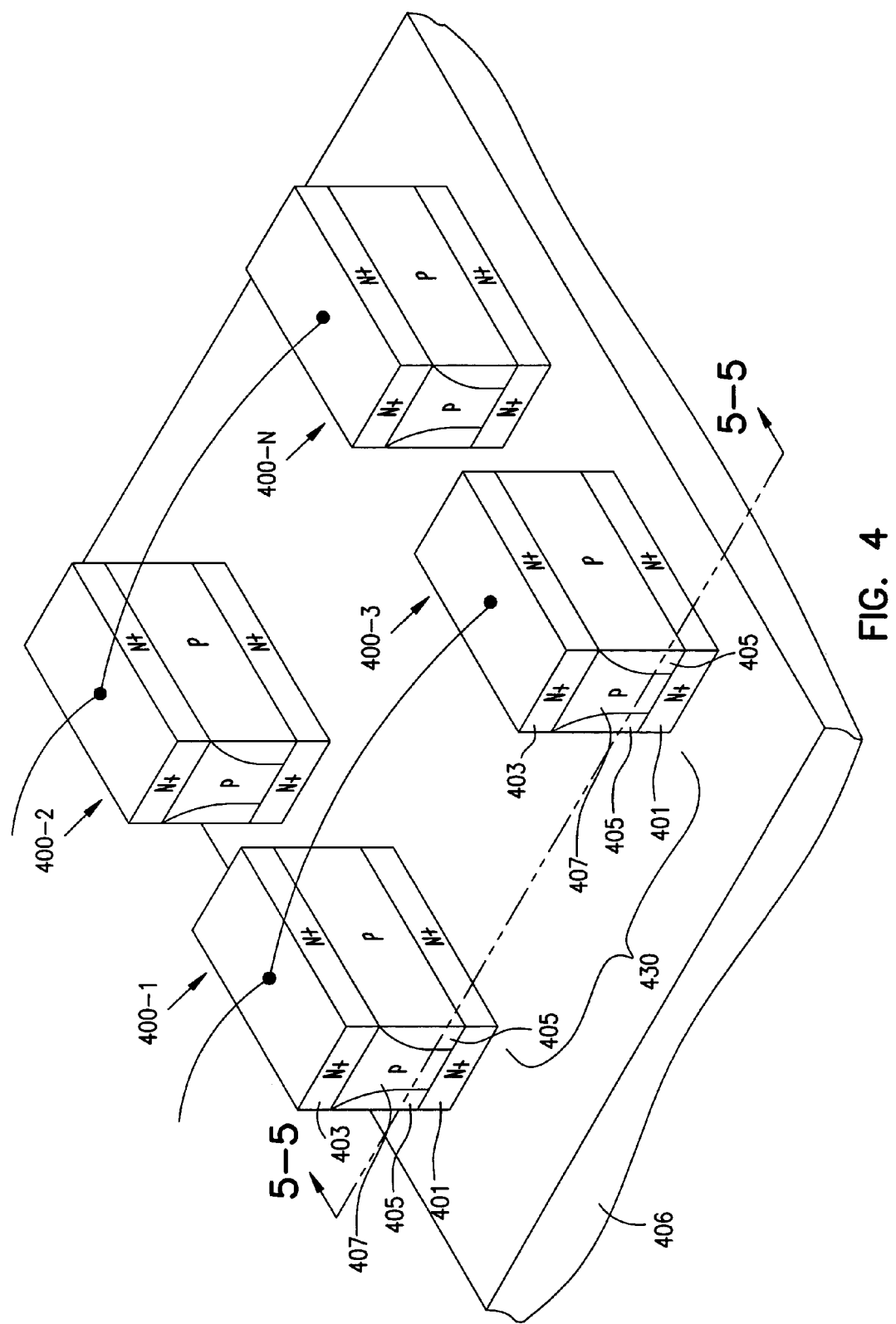
FIG. 4 is a perspective view illustrating an array of silicon pillars formed on a substrate as used in one embodiment according to the teachings of the present invention.

FIG. 4 is a perspective view illustrating an array of silicon pillars 400-1, 400-2, 400-3, . . . , 400-N, formed on a substrate 406 as used in one embodiment according to the teachings of the present invention. As will be understood by one of ordinary skill in the art upon reading this disclosure, the substrates can be (i) conventional p-type bulk silicon or p-type epitaxial layers on p+ wafers, (ii) silicon on insulator formed by conventional SIMOX, wafer bonding and etch back or silicon on sapphire, or (iii) small islands of silicon on insulator.

As shown in FIG. 4, each pillar in the array of silicon pillars 400-1, 400-2, 400-3, . . . , 400-N, includes a first source/drain region 401 and a second source/drain region 403. The first and the second source/drain regions, 401 and 403, are separated by a body region 407 including channel regions 405. As shown in FIG. 4, a number of trenches 430 separate adjacent pillars in the array of silicon pillars 400-1, 400-2, 400-3, . . . , 400-N. Trenches 430 are referenced in connection with the discussion which follows in connection with FIGS. 5A–5E.

Figure 5A:
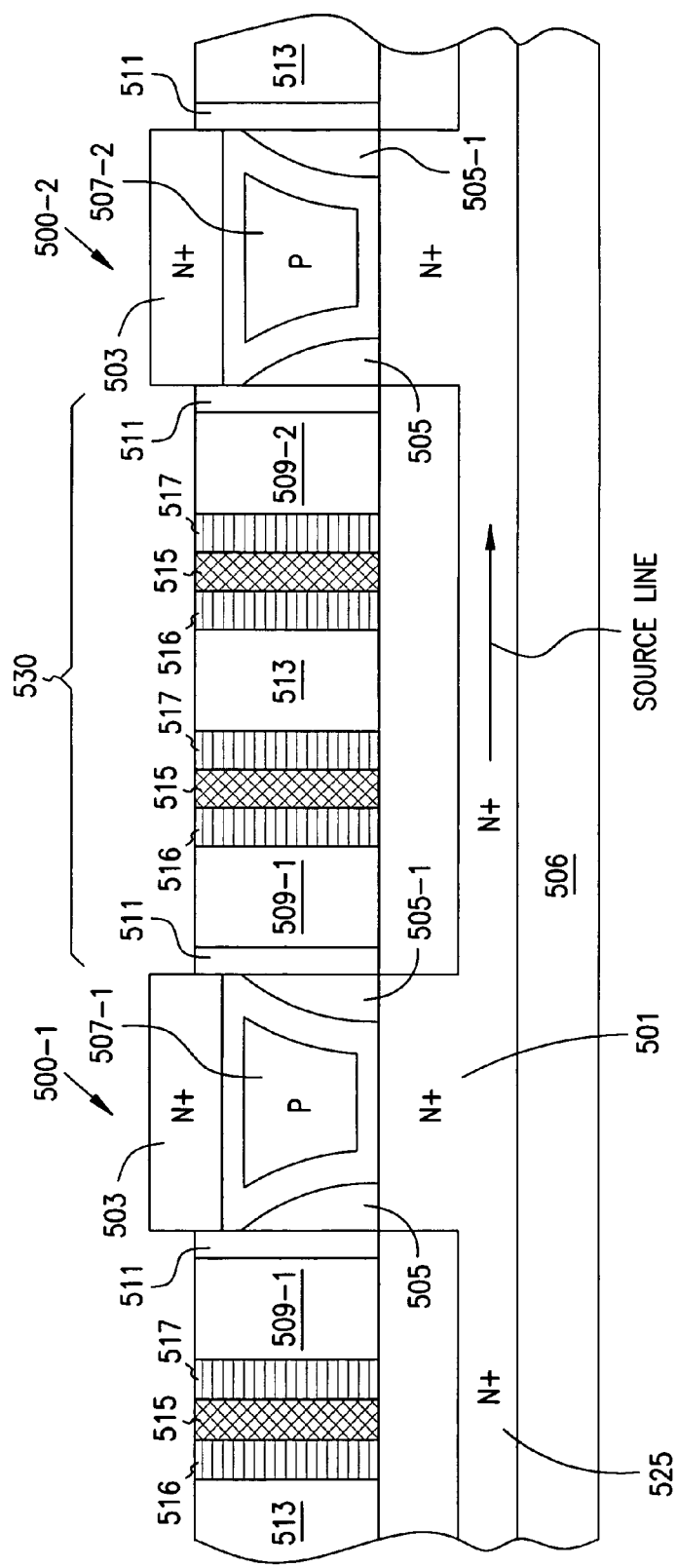

FIGS. 5A–5E are cross sectional views taken along cut line 5—5 from FIG. 4. As mentioned above in connection with FIG. 3, a number of floating gate and control gate configurations are included in the present invention. FIG. 5A illustrates one such embodiment of the present invention. FIG. 5A illustrates a first source/drain region 501 and second source/drain region 503 for a DEAPROM memory cell 500 formed according to the teachings of the present invention. As shown in FIG. 5, the first and second source/drain regions, 501 and 503, are contained in a pillar of semiconductor material, and separated by a body region 507 including channel regions 505. As shown in the embodiments of FIGS. 5A–5E, the first source/drain region 501 is integrally connected to a buried sourceline 525. As one or ordinary skill in the art will understand upon reading this disclosure the buried sourceline 525 is be formed of semiconductor material which has the same doping type as the first source/drain region 501. In one embodiment, the sourceline 525 is formed of semiconductor material of the same doping as the first source/drain region 501, but is more heavily doped than the first source/drain region 501.

As shown in the embodiment of FIG. 5A, a pair of floating gates 509-1 and 509-2 are formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In this embodiment, a single control gate 513 is shared by the pair of floating gates 509-1 and 509-2 on opposing sides of the trench 530. As one of ordinary skill in the art will understand upon reading this disclosure, the shared single control gate 513 can include an integrally formed control gate line. As shown in FIG. 5A, such an integrally formed control gate line 513 can be one of a plurality of control gate lines which are each independently formed in the trench, such as trench 530, below the top surface of the pillars 500-1 and 500-2 and between the pair of floating gates 509-1 and 509-2. In one embodiment, according to the teachings of the present invention, each floating gate, e.g. 509-1 and 509-2, includes a vertically oriented floating gate having a vertical length of less than 100 nanometers.

Figure 5B:
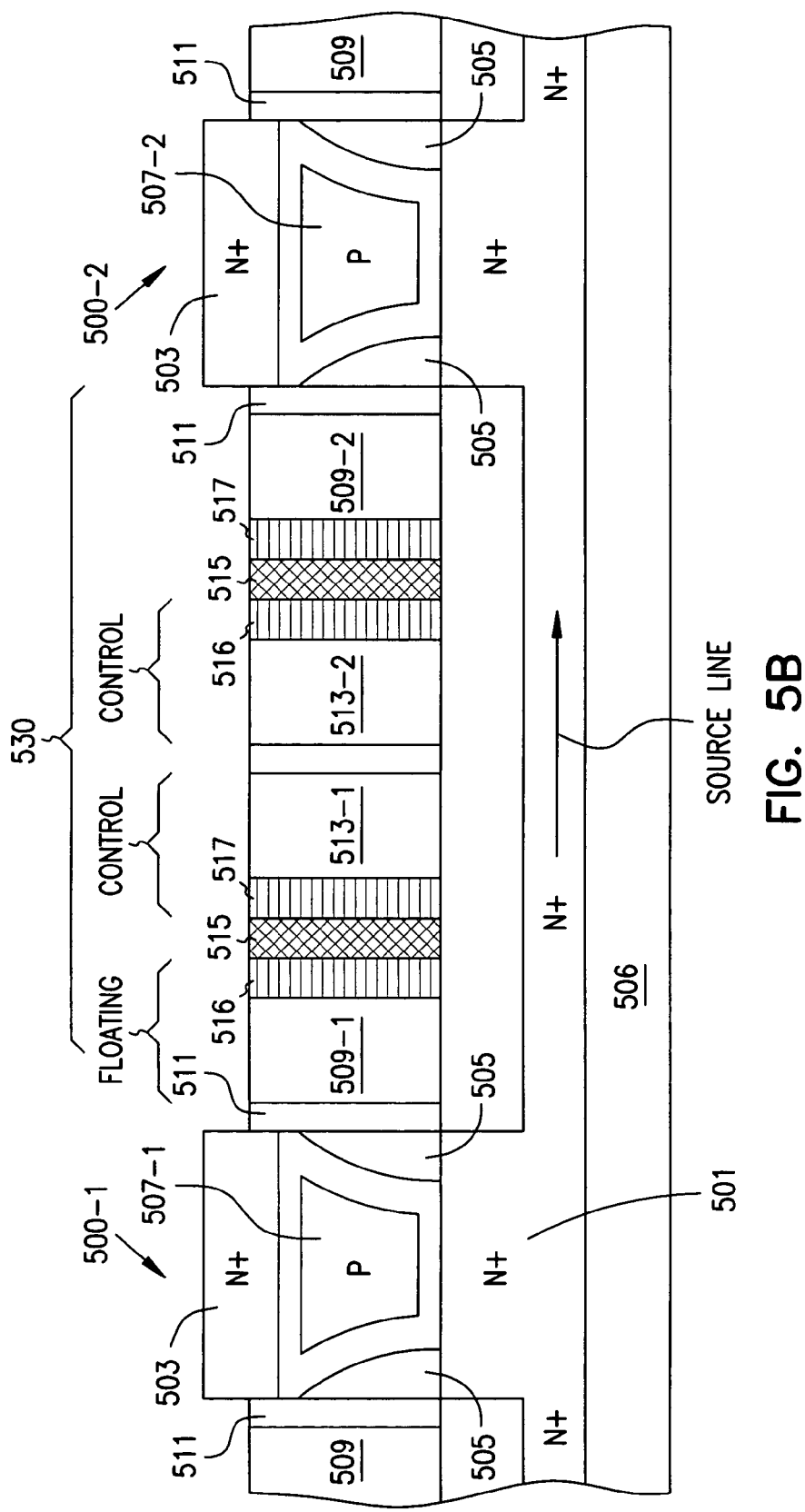

As shown in the embodiment of FIG. 5B, a pair of floating gates 509-1 and 509-2 are formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In the embodiment of FIG. 5B, a plurality of control gate lines are again formed in trenches, e.g. trench 530, below the top surface of the pillars, 500-1 and 500-2, and between the pair of floating gates 509-1 and 509-2. However, in this embodiment, each trench, e.g. 530, houses a pair of control gate lines, shown as 513-1 and 513-2. Each one of the pair of control gate lines 513-1 and 513-2 adresses the floating gates, 509-1 and 509-2 respectively, on opposing sides of the trench 530. In this embodiment, the pair of control gate lines, or control gates 513-1 and 513-2 are separated by an insulator layer.

As shown in the embodiment of FIG. 5C, a pair of floating gates 509-1 and 509-2 are again formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In the embodiment of FIG. 5C, the plurality of control gate lines are disposed vertically above the floating gates. That is, in one embodiment, the control gate lines are located above the pair of floating gates 509-1 and 509-2 and not fully beneath the top surface of the pillars 500-1 and 500-2. In the embodiment of FIG. 5C, each pair of floating gates, e.g. 509-1 and 509-2, in a given trench shares a single control gate line, or control gate 513.

Figure 5D:
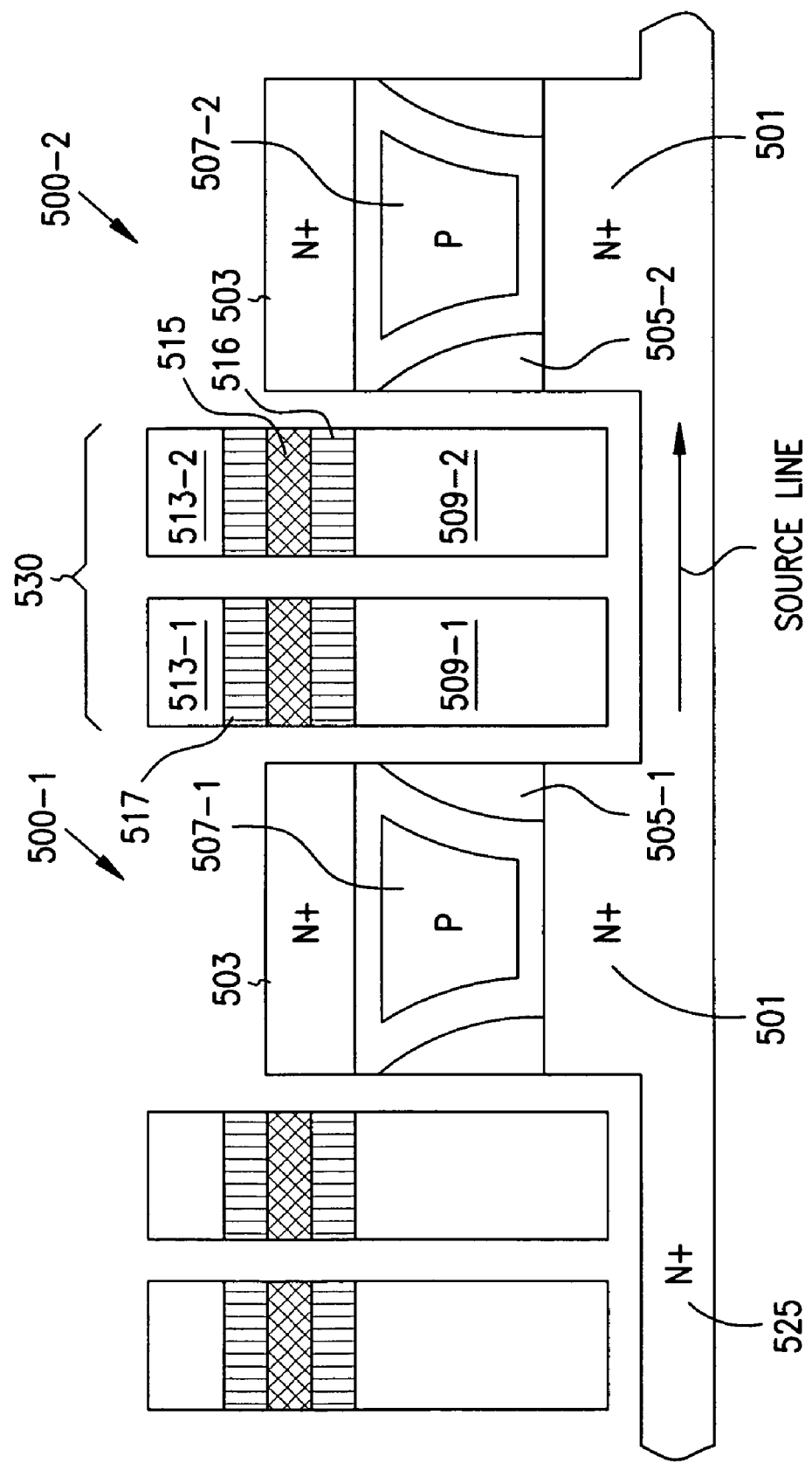

As shown in the embodiment of FIG. 5D, a pair of floating gates 509-1 and 509-2 are formed in each trench 530 between adjacent pillars which form memory cells 500-1 and 500-2. Each one of the pair of floating gates, 509-1 and 509-2, respectively opposes the body regions 507-1 and 507-2 in adjacent pillars 500-1 and 500-2 on opposing sides of the trench 530.

In the embodiment of FIG. 5D, the plurality of control gate lines are disposed vertically above the floating gates. That is, in one embodiment, the control gate lines are located above the pair of floating gates 509-1 and 509-2 and not fully beneath the top surface of the pillars 500-1 and 500-2. However, in the embodiment of FIG. 5D, each one of the pair of floating gates, e.g. 509-1 and 509-2, is addressed by an independent one of the plurality of control lines or control gates, shown in FIG. 5D as 513-1 and 513-2.

Figure 5E:
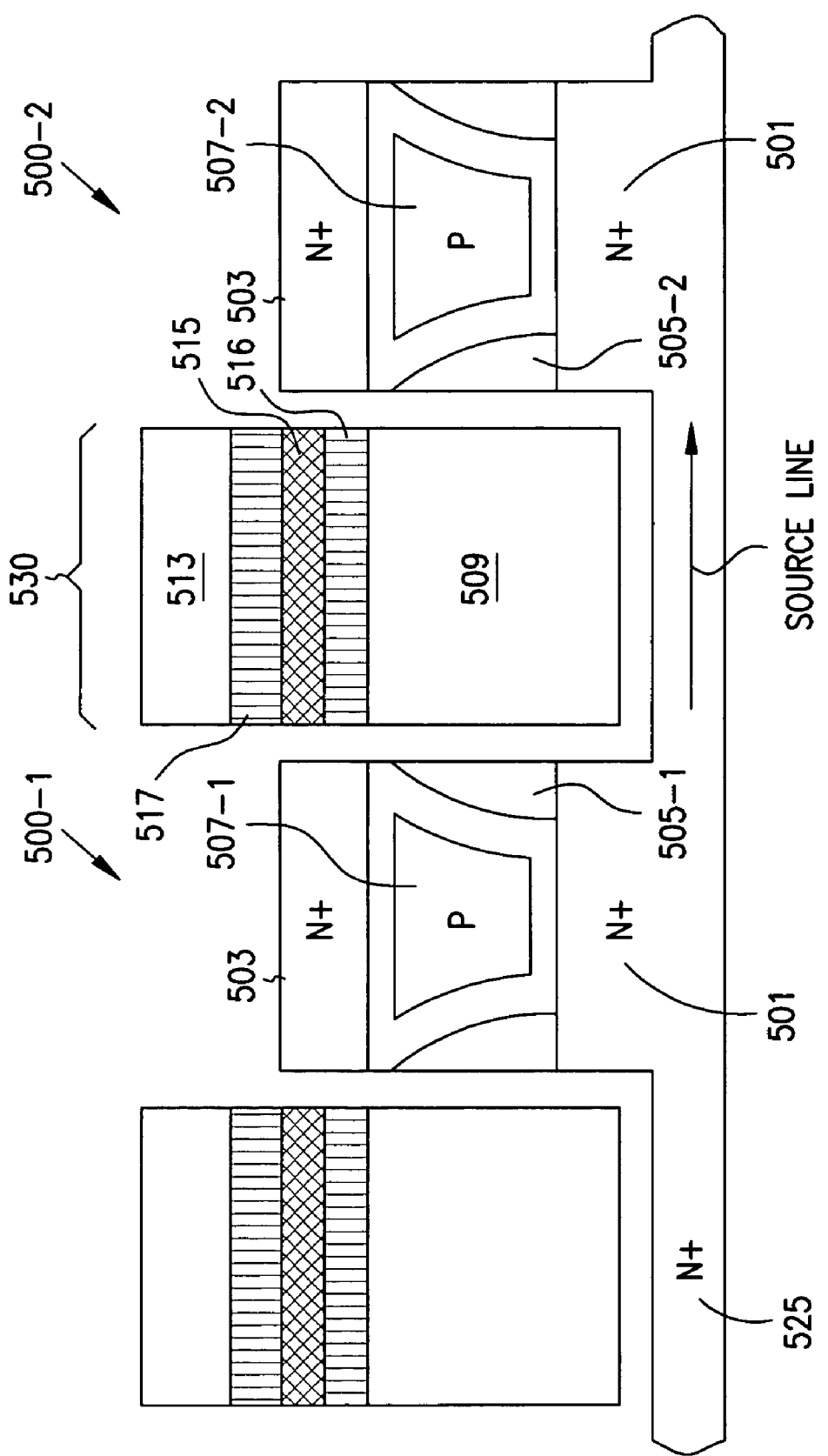

As shown in the embodiment of FIG. 5E, a single floating gate 509 is formed in each trench 530 between adjacent pillars which form memory cells 500-1 and 500-2. According to the teachings of the present invention, the single floating gate 509 can be either a vertically oriented floating gate 509 or a horizontally oriented floating gate 509 formed by conventional processing techniques, or can be a horizontally oriented floating gate 509 formed by replacement gate techniques. In one embodiment of the present invention, the floating gate 509 has a vertical length facing the body region 505 of less than 100 nm. In another embodiment, the floating gate 509 has a vertical length facing the body region 505 of less than 50 nm. In one embodiment, as shown in FIG. 5E, the floating gate 509 is shared, respectively, with the body regions 507-1 and 507-2, including channel regions 505-1 and 505-2, in adjacent pillars 500-1 and 500-2 located on opposing sides of the trench 530. And, as shown in FIG. 5E, the control gate includes a single horizontally oriented control gate line, or control gate 513 formed above the horizontally oriented floating gate 509.

As one of ordinary skill in the art will understand upon reading this disclosure, in each of the embodiments described above in connection with FIGS. 5A–5E the floating gates 509 are separated from the control gate lines, or control gates 513 with a low tunnel barrier intergate insulator in accordance with the descriptions given above in connection with FIG. 3. That is, according to the teachings of the present invention, the low tunnel barrier intergate insulator has a thickness of less than 20 Angstroms and/or a low tunnel barrier of less than 1.5 eV. The modifications here are to use tunneling through the interpoly dielectric to realize DEAPROM memory devices which require refresh. The vertical devices include an extra flexibility in that the capacitors, e.g. gate oxide and intergate insulator, are easily fabricated with different areas. This readily allows the use of very high dielectric constant inter-poly dielectric insulators with lower tunneling barriers.

FIGS. 6A–6D illustrate that a number of address coincidence schemes can be used together with the present invention. FIG. 6A illustrates a NOR DEAPROM memory array 610 having a number of DEAPROM memory cells 600-1, 600-2, 600-3, using a coincidence address array scheme. For purposes of illustration, FIG. 6A shows a sourceline 625 coupled to a first source/drain region 601 in each of the number of DEAPROM memory cells 600-1, 600-2, 600-3. The sourceline is shown oriented in a first selected direction in the DEAPROM memory array 610. In FIG. 6A, a number of control gate lines 630 are shown oriented in a second selected direction in the DEAPROM memory array 610. As shown in FIG. 6A, the number of control gate lines 630 are coupled to, or integrally formed with the control gates 613 for the number of DEAPROM memory cells 600-1, 600-2, 600-3. As shown in FIG. 6A, the second selected direction is orthogonal to the first selected direction. Finally, FIG. 6A shows a number of bitlines 635 oriented in a third selected direction in the DEAPROM memory array 610. As shown in FIG. 6A, the number of bitlines are coupled to the second source/drain regions in the number of DEAPROM memory cells 600-1, 600-2, 600-3. In the embodiment shown in FIG. 6A the third selected direction is parallel to the second selected direction and the number of control gate lines 630 serve as address lines. Also, as shown in FIG. 6A, the DEAPROM memory array 610 includes a number of backgate or substrate/well bias address lines 640 coupled to the substrate.

Figure 6B:
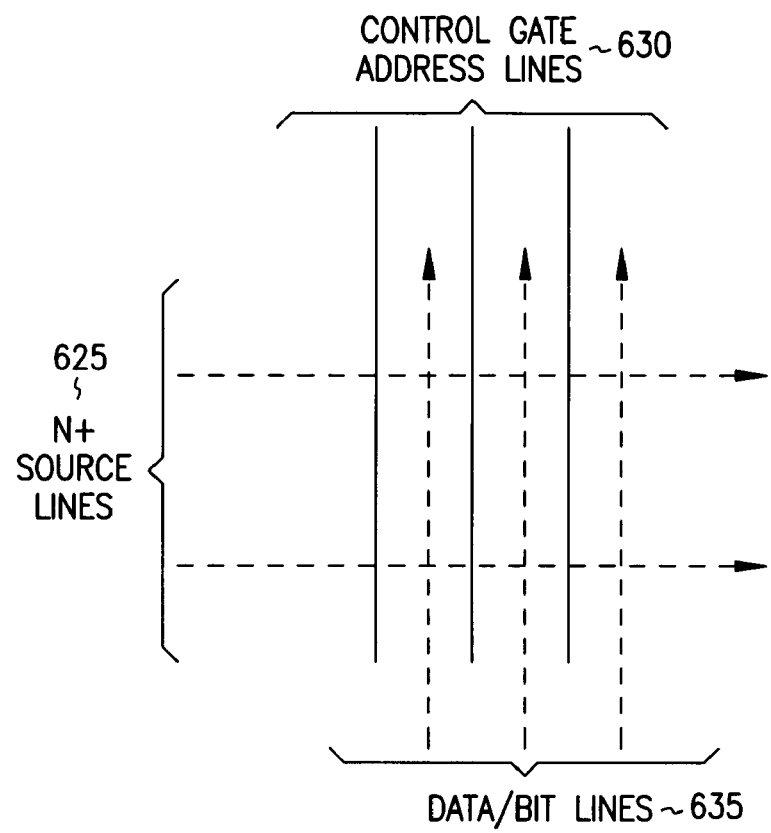
Figure 6C:
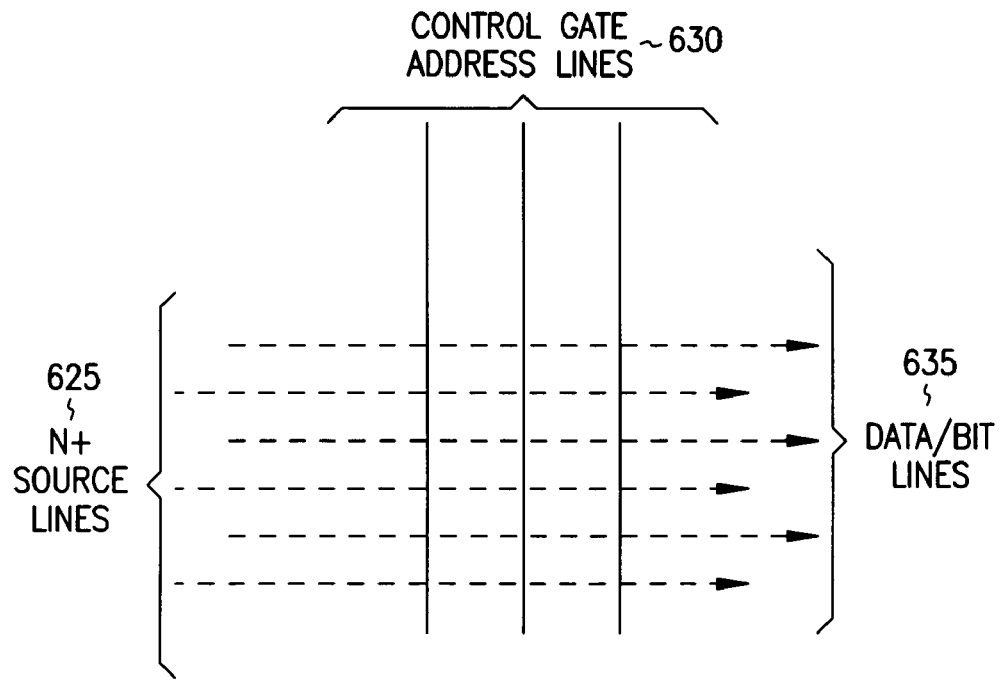
Figure 6D:
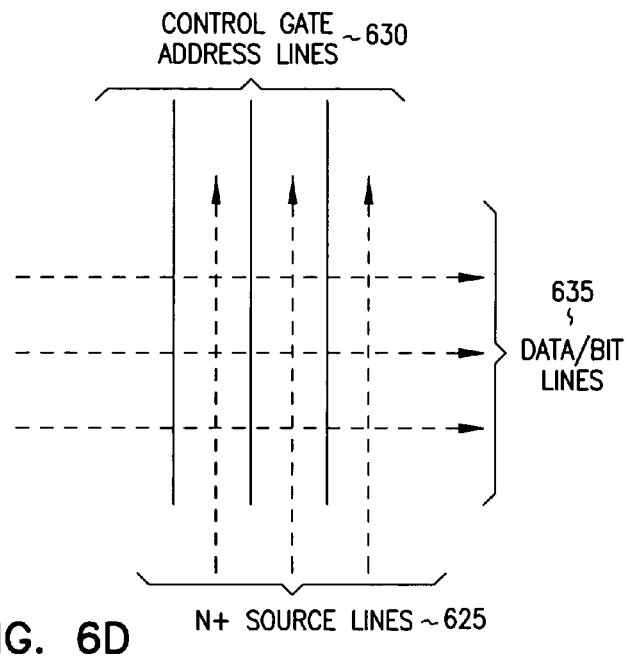

Using FIG. 6A as a reference point, FIGS. 6B-6D illustrate of top view for three different coincidence address scheme layouts suitable for use with the present invention. First, FIG. 6B provides the top view layout of the coincidence address scheme described in connection with FIG. 6A. That is, FIG. 6B illustrates a number of sourcelines 625 oriented in a first selected direction, a number of control gate lines 630 oriented in a second selected direction, and a number of bitlines 635 oriented in a third selected direction for the DEAPROM memory array 600. As explained above in connection with FIG. 6A, in this embodiment, the second and third selected direction are parallel to one another and orthogonal to the first selected direction such that the number of control gate lines 630 serve as address lines.

FIG. 6C provides the top view layout of another coincidence address scheme according to the teachings of the present invention. This is, FIG. 6C illustrates a number of sourcelines 625 oriented in a first selected direction, a number of control gate lines 630 oriented in a second selected direction, and a number of bitlines 635 oriented in a third selected direction for the DEAPROM memory array 600. In the embodiment of FIG. 6C, the first selected direction and the third selected direction are parallel to one another and orthogonal to the second selected direction. In this embodiment, the number of control gate lines 630 again serve as address lines.

FIG. 6D provides the top view layout of yet another coincidence address scheme according to the teachings of the present invention. This is, FIG. 6D illustrates a number of sourcelines 625 oriented in a first selected direction, a number of control gate lines 630 oriented in a second selected direction, and a number of bitlines 635 oriented in a third selected direction for the DEAPROM memory array 600. In the embodiment of FIG. 6D, the first selected direction and the second selected direction are parallel to one another and orthogonal to the third selected direction. In this embodiment, the number of bitlines 635 serve as address lines.

As will be apparent to one of ordinary skill in the art upon reading this disclosure, and as will be described in more detail below, write can still be achieved by hot electron injection and/or, according to the teachings of the present invention, tunneling from the control gate. According to the teachings of the present invention, block erase is accomplished by driving the control gates with a relatively large positive voltage and tunneling from the metal on top of the floating gate to the metal on the bottom of the control gate.

FIG. 7A is an energy band diagram illustrating the band structure at vacuum level with the low tunnel barrier interpoly insulator according to the teachings of the present invention. FIG. 7A is useful in illustrating the reduced tunnel barrier off of the floating gate to the control gate and for illustrating the respective capacitances of the structure according to the teachings of the present invention.

FIG. 7A shows the band structure of the silicon substrate, e.g. channel region 701, silicon dioxide gate insulator, e.g. gate oxide 703, polysilicon floating gate 705, the low tunnel barrier interpoly dielectric 707, between metal plates 709 and 711, and then the polysilicon control gate 713, according to the teachings of the present invention. FIG. 7A illustrates the conventional silicon oxide gate insulator 703 between the floating gate 705 and the channel region 701 with a high barrier, e.g. 3.2 eV. FIG. 7A further illustrates the low tunnel barrier interpoly insulator 707 between the floating gate 705 and the control gate 713. According to the teachings of the present invention, if the interpoly dielectric 707 is thin enough, e.g. less than 20 Angstroms, or the barrier is low enough, e.g. less than 1.5 eV, to allow a very easy erase then there will be some finite leakage current when the device is addressed for read operations and/or is in a standby state. Thus, according to the teachings of the present invention, this will require refresh of the memory state for the DEAPROM.

The design considerations involved are determined by the dielectric constant, thickness and tunneling barrier height of the interpoly dielectric insulator 707 relative to that of the silicon dioxide gate insulator, e.g. gate oxide 703. The tunneling probability through the interpoly dielectric 707 is an exponential function of both the barrier height and the electric field across this dielectric.

FIG. 7B is an energy band diagram illustrating the band structure during an erase operation of electrons from the floating gate 705 to the control gate 713 across the low tunnel barrier interpoly insulator 707 according to the teachings of the present invention. FIG. 7B is similarly useful in illustrating the reduced tunnel barrier off of the floating gate 705 to the control gate 713 and for illustrating the respective capacitances of the structure according to the teachings of the present invention.

As shown in FIG. 7B, the electric field is determined by the total voltage difference across the structure, the ratio of the capacitances (see FIG. 7A), and the thickness of the interpoly dielectric 707. The voltage across the interpoly dielectric 707 will be, $\Delta V2 = V\, C1/(C1+C2)$, where V is the total applied voltage. The capacitances, C, of the structures depends on the dielectric constant, $\in_r$, the permittivity of free space, $e_o$, and the thickness of the insulating layers, t, and area, A, such that $C = \in_r \in_o A/t$, Farads/cm$^2$, where $\in_r$ represents the low frequency dielectric constant. The electric field across the interpoly dielectric insulator 707, having capacitance, C2, will then be $E2 = \Delta V2/t2$, where t2 is the thickness of this layer.

The tunneling current in erasing charge from the floating gate 705 by tunneling to the control gate 713 will then be as shown in FIG. 7B given by an equation of the form:

$$J = B\, \exp(-Eo/E)$$

$$J = \frac{q^2 E^2}{4\pi h \Phi} e^{-E_o/E}$$

$$E_o = \frac{8\pi}{3} \frac{\sqrt{2m q^*}}{h} \Phi^{3/2}$$

where E is the electric field across the interpoly dielectric insulator 707 and Eo depends on the barrier height. Aluminum oxide which has a current density of 1 A/cm$^2$ at a field of about E=1V/20 A=5×10$^{+6}$ V/cm. Silicon oxide transistor gate insulators have a current density of 1 A/cm$^2$ at a field of about E=2.3V/23 A=1×10$^{+7}$ V/cm.

The lower electric field in the aluminum oxide interpoly insulator 707 for the same current density reflects the lower tunneling barrier of less than 2.0 eV, shown in FIG. 7B, as opposed to the 3.2 eV tunneling barrier of silicon oxide 703, also illustrated in FIG. 7B. Low barriers, according to the teachings of the present invention, will result in high current densities at low electric fields during write and erase, however, they will also conduct some small but significant current during the electric fields employed for read and as a consequence the data must be refreshed. Thus, the DEAPROM devices of the present invention work on a dynamic basis.

FIG. 7C is a graph plotting tunneling currents versus the applied electric fields (reciprocal applied electric field shown) for a number of barrier heights. FIG. 7C illustrates the dependence of the tunneling currents on electric field (reciprocal applied electric field) and barrier height. The fraction of voltage across the interpoly or intergate insulator, $\Delta V2$, can be increased by making the area of the intergate capacitor, C2, (e.g. intergate insulator 707) smaller than the area of the transistor gate capacitor, C1 (e.g. gate oxide 703). This would be required with high dielectric constant intergate dielectric insulators 707 and is easily realized with the vertical floating gate structures described above in connection with FIGS. 3, and 5A–5E.

Figure 8:
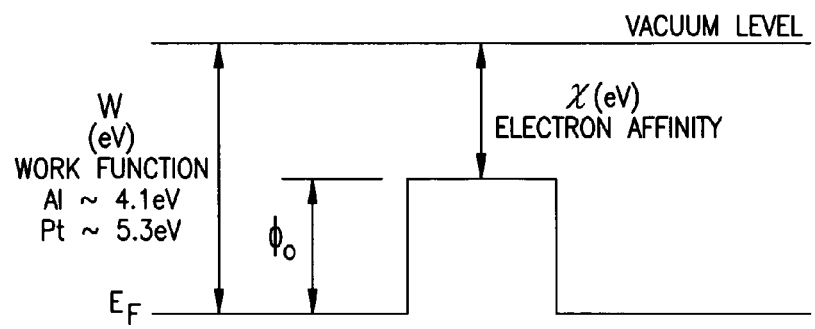
FIG. 8 is an energy band diagram illustrating work function, tunnel barrier heights and electron affinities for a low tunnel barrier intergate insulator according to the teachings of the present invention.

FIG. 8 is an energy band diagram illustrating work function, tunnel barrier heights and electron affinities for a low tunnel barrier intergate insulator according to the teachings of the present invention.

Table A illustrates insulators of the order of 0.6 to 1.5 eV which are appropriate for use as the low tunnel barrier intergate insulator of the present invention. The values shown are for low tunnel barrier intergate insulators selected from the group consisting of NiO, $Al_2O_3$, $Ta_2O_5$, $TiO_2$, $ZrO_2$, $Nb_2O_5$, $Y_2O_3$, $Gd_2O_3$, $SrBi_2Ta_2O_9$, $SrTiO_3$, $PbTiO_3$, and $PbZrO_3$. Also, as described above, the floating gate will include a polysilicon floating gate having a metal layer formed thereon in contact with the low tunnel barrier intergate insulator and the control gate will include a polysilicon control gate having a metal layer formed thereon in contact with the low tunnel barrier intergate insulator. In one embodiment, the metal layers are formed of platinum (Pt). In an alternative embodiment, the metal layers are formed of aluminum (Al). Thus, Table A illustrates the tunneling barrier values for the low tunnel barrier intergate insulator formed between these respective metal layers.

TABLE A

|  | $E_G$ | $\in_r$ | $\in_\infty$ | $\chi$ | $\Phi_o(Pt)$ | $\Phi_o(Al)$ |
|---|---|---|---|---|---|---|
| Conventional Insulators |  |  |  |  |  |  |
| $SiO_2$ | ~8 eV | 4 | 2.25 | 0.9 eV |  | 3.2 eV |
| $Si_3N_4$ | ~5 eV | 7.5 | 3.8 |  |  | 2.4 eV |
| Metal Oxides |  |  |  |  |  |  |
| $Al_2O_3$ | 7.6 eV | 9 to 11 | 3.4 |  |  | ~2 ev |
| NiO |  |  |  |  |  |  |
| Transition Metal Oxides |  |  |  |  |  |  |
| $Ta_2O_5$ | 4.65–4.85 |  | 4.8 | 3.3 | 2.0 | 0.8 eV |
| $TiO_2$ | 6.8 | 30 80 | 7.8 | 3.9 | Est. 1.2 eV |  |
| $ZrO_2$ | 5–7.8 | 18.5 25 | 4.8 | 2.5 |  | 1.4 |
| $Nb_2O_5$ | 3.1 | 35–50 |  |  |  |  |
| $Y_2O_3$ | 6 |  | 4.4 |  |  | 2.3 |
| $Gd_2O_3$ |  |  |  |  |  |  |
| Perovskite Oxides |  |  |  |  |  |  |
| $SrBi_2Ta_2O_3$ | 4.1 |  | 5.3 | 3.3 | 2.0 | 0.8 eV |
| $SrTiO_3$ | 3.3 |  | 6.1 | 3.9 | 1.4 | 0.2 eV |
| $PbTiO_3$ | 3.4 |  | 6.25 | 3.5 | 1.8 | 0.6 eV |
| PbZrO | 3.7 |  | 4.8 |  | Est. 1.4 eV | 0.2 eV |

Methods of Formation

Several examples are outlined below in order to illustrate how a diversity of such metal oxide tunnel barriers can be formed, according to the teachings of the present invention. Processing details and precise pathways taken which are not expressly set forth below will be obvious to one of ordinary skill in the art upon reading this disclosure. Firstly, although not included in the details below, it is important also to take into account the following processing factors in connection with the present invention:

(i) The poly-Si layer is to be formed with emphasis on obtaining a surface that is very smooth and morphologically stable at subsequent device processing temperatures which will exceed that used to grow Metal oxide.

(ii) The native $SiO_x$ oxide on the poly-Si surface must be removed (e.g., by sputter cleaning in an inert gas plasma in situ) just prior to depositing the metal film. The electrical characteristics of the resultant Poly-Si/Metal/Metal oxide/Metal/Poly-Si structure will be better defined and reproducible than that of a Poly-Si/Native $SiO_x$/Metal/Metal oxide/Poly-Si structure.

(iii) The oxide growth rate and limiting thickness will increase with oxidation temperature and oxygen pressure. The oxidation kinetics of a metal may, in some cases, depend on the crystallographic orientations of the very small grains of metal which comprise the metal film. If such effects are significant, the metal deposition process can be modified in order to increase its preferred orientation and subsequent oxide thickness and tunneling uniformity. To this end, use can be made of the fact that metal films strongly prefer to grow during their depositions having their lowest free energy planes parallel to the film surface. This preference varies with the crystal structure of the metal. For example, fcc metals prefer to form {111} surface plans. Metal orientation effects, if present, would be larger when only a limited fraction of the metal will be oxidized and unimportant when all or most of the metal is oxidized.

(iv) Modifications in the structure shown in FIG. 2 may be introduced in order to compensate for certain properties in some metal/oxide/metal layers. Such changes are reasonable since a wide range of metals, alloys and oxides with quite different physical and chemical properties can be used to form these tunnel junctions.

EXAMPLE I

Formation of $Al_2O_3$ or NiO Tunnel Barriers

As stated above, the conventional large barrier insulating dielectrics are silicon oxide and silicon nitride. The realities are that silicon oxide is not an optimum choice for memory type devices, because the 3.2 eV tunnel barrier is too high resulting in premature failure of the insulators and limiting the number of operational cycles to be in the order of $10^5$ to $10^7$.

According to one embodiment of the present invention, a low tunneling barrier interpoly insulator is used instead, such as $Al_2O_3$ or NiO having a thickness of less than 20 Angstroms so that the tunneling barrier is less than 1.5 eV. A number of studies have dealt with electron tunneling in $Al/Al_2O_3/Al$ structures where the oxide was grown by "low temperature oxidation" in either molecular or plasma oxygen. Before sketching out a processing sequence for these tunnel barriers, note:

(i) Capacitance and tunnel measurements indicate that the $Al_2O_3$ thickness increases with the log (oxidation time), similar to that found for PbO/Pb as well as a great many other oxide/metal systems.

(ii) Tunnel currents are asymmetrical in this system with somewhat larger currents flowing when electrons are injected from the $Al/Al_2O_3$ interface developed during oxide growth. This asymmetry is due to a minor change in composition of the growing oxide: there is a small concentration of excess metal in the $Al_2O_3$, the concentration of which diminishes as the oxide is grown thicker. The excess $Al^{+3}$ ions produce a space charge that lowers the tunnel barrier at the inner interface. The oxide composition at the outer $Al_2O_3/Al$ contact is much more stoichiometric and thus has a higher tunnel barrier. In situ ellipsometer measurements on the thermal oxidation of Al films deposited and oxidized in situ support this model. In spite of this minor complication, $Al/Al_2O_3/Al$ tunnel barriers can be formed that will produce predictable and highly controllable tunnel currents that can be ejected from either electrode. The magnitude of the currents are still primarily dominated by $Al_2O_3$ thickness which can be controlled via the oxidation parametrics.

With this background, we can proceed to outline one process path out of several that can be used to form $Al_2O_3$ tunnel barriers. Here the aluminum is thermally oxidized although one could use other techniques such as plasma oxidation or rf sputtering in an oxygen plasma. For the sake of brevity, some details noted above will not be repeated.

(i) Sputter deposit aluminum on poly-Si at a temperature of ~25 to 150 degrees C. Due to thermodynamic forces, the micro-crystallites of the f.c.c. aluminum will have a strong and desirable (111) preferred orientation.

(ii) Oxidize the aluminum in situ in molecular oxygen using temperatures, pressure and time to obtain the desired $Al_2O_3$ thickness. The thickness increases with log (time) and can be controlled via time at a fixed oxygen pressure and temperature to within 0.10 Angstroms, when averaged over a large number of aluminum grains that are present under the counter-electrode. One can readily change the $Al_2O_3$ thickness from ~15 to 35 Å by using appropriate oxidation parametrics. The oxide will be amorphous and remain so until temperatures in excess of 400 degrees C. are reached. The initiation of recrystallization and grain growth can be suppressed, if desired, via the addition of small amounts of glass forming elements (e.g., Si) without altering the growth kinetics or barrier heights significantly.

(iii) Re-evacuate the system and deposit a second layer of aluminum.

(iv) Deposit the Poly-Si control gate layer using conventional processes.

In an alternative embodiment, nickel (Ni) can be oxidized to form thin super-conducting tunnel diodes or tunneling magnetoresistive elements.

Figure 9:
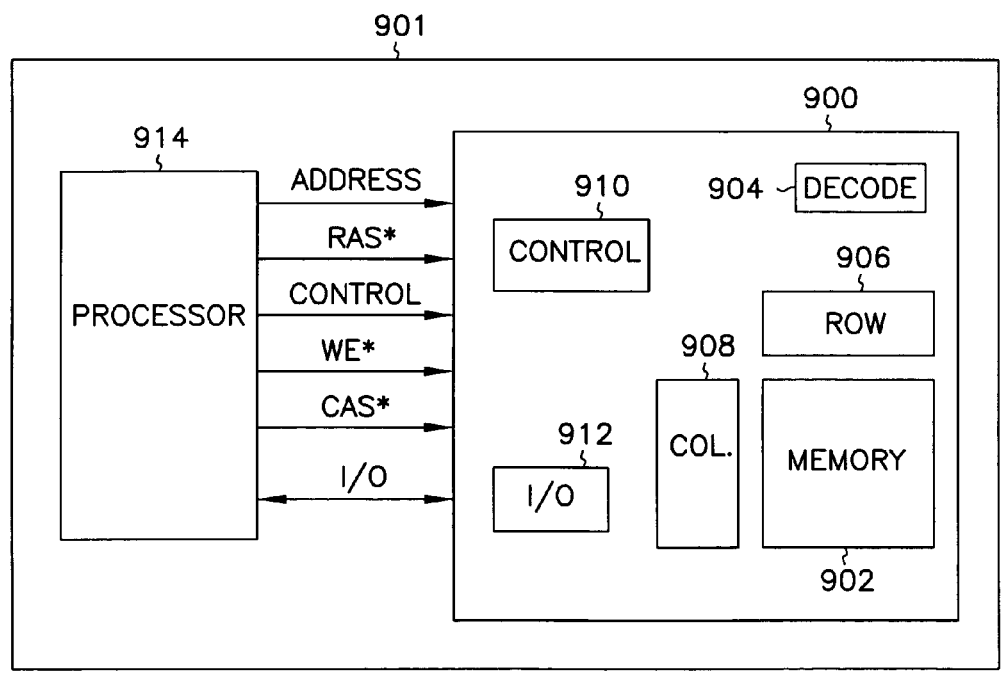
FIG. 9 illustrates a block diagram of an embodiment of an electronic system according to the teachings of the present invention.

As mentioned above, these oxide insulators are used as low tunnel barriers, of the order 0.6 to 1.5 eV, as the inter-poly or inter-gate dielectric insulators. The characteristics of these oxide insulators are also summarized in FIG. 10. According to the teachings of the present invention, low barriers are utilized in dynamic memory elements which are easy to write and/or erase but as a consequence of the low barrier require refresh. To achieve the correct barrier height different contact metals as for instance aluminum (Al) and platinum (Pt) may be used as illustrated in FIGS. 2 and 3. That is according to the teachings of the present invention the floating gate includes a polysilicon floating gate having a metal layer formed thereon in contact with the low tunnel barrier intergate insulator. Likewise, as described above the control gate includes a polysilicon control gate having a metal layer formed thereon in contact with the low tunnel barrier intergate insulator. In one embodiment, the metal layers are formed of platinum (Pt). In an alternative embodiment, the metal layers are formed of aluminum (Al). FIG. 9 illustrates the tunneling barrier values for the $Al_2O_3$ and NiO intergate insulator embodiments formed between these respective metal layers. In conjunction with these embodiments of the invention, the low tunnel barrier interpoly insulator is formed with a thickness of less than 20 Angstroms such that the tunnel barrier is less than 1.5 eV.

EXAMPLE II

Formation of Single- and Multi-Layer Transition Metal Oxide Tunnel Barriers

The band gap energies and barrier heights of some conventional gate insulators as silicon oxide, silicon nitride and aluminum oxide as well as tantalum oxide have been investigated and described in detail. Formation of single and double-layer dielectric layers of oxides of $Ta_2O_5$ and similar transition metal oxides can be accomplished by thermal as well as plasma oxidation of films of these metals.

In some cases the characteristics of the resulting dielectric insulators are not yet well known or well defined. Part of this detail is recounted as follows.

For example, single layers of $Ta_2O_5$, $TiO_2$, $ZrO_2$, $Nb_2O_5$ and similar transition metal oxides can be formed by "low temperature oxidation" of numerous Transition Metal (e.g., TM oxides) films in molecular and plasma oxygen and also by rf sputtering in an oxygen plasma. The thermal oxidation kinetics of these metals have been studied for decades. In essence, such metals oxidize via logarithmic kinetics to reach thicknesses of a few to several tens of angstroms in the range of 100 to 300 C. Excellent oxide barriers for Josephson tunnel devices can be formed by rf sputter etching these metals in an oxygen plasma. Such "low temperature oxidation" approaches differ considerably from MOCVD processes used to produce these TM oxides. MOCVD films require high temperature oxidation treatments to remove carbon impurities, improve oxide stoichiometry and produce recrystallization. Such high temperature treatments also cause unwanted interactions between the oxide and the underlying silicon and thus have necessitated the introduction of interfacial barrier layers.

An approach was developed utilizing "low temperature oxidation" to form duplex layers of TM oxides. Unlike MOCVD films, the oxides are very pure and stoichiometric as formed. They do require at least a brief high temperature (est. 700 to 800 degrees C. but may be lower) treatment to transform their microstructures from amorphous to crystalline and thus increase their dielectric constants to the desired values (>20 or so). Unlike MOCVD oxides, this treatment can be carried out in an inert gas atmosphere, thus lessening the possibility of inadvertently oxidizing the poly-Si floating gate. While this approach was directed at developing methods and procedures for producing high dielectric constant films for storage cells for DRAMs, the same teachings can be applied to producing thinner metal oxide tunnel films for DEAPROM memory devices described. The dielectric constants of these TM oxides are substantially greater (>25 to 30 or more) than those of PbO and $Al_2O_3$. Duplex layers of these high dielectric constant oxide films are easily fabricated with simple tools and also provide improvement in device yields and reliability. Each oxide layer will contain some level of defects but the probability that such defects will overlap is exceedingly small. Effects of such duplex layers were first reported by one of the present authors, J. M. Eldridge, and are well known to practitioners of the art. It is worth mentioning that highly reproducible TM oxide tunnel barriers can be grown by rf sputtering in an oxygen ambient. Control over oxide thickness and other properties in these studies were all the more remarkable in view of the fact that the oxides were typically grown on thick (e.g., 5,000 Å) metals such as Nb and Ta. In such metal-oxide systems, a range of layers and suboxides can also form, each having their own properties. In the present disclosure, control over the properties of the various TM oxides will be even better since we employ very limited thicknesses of metal (perhaps 10 to 100 Å or so) and thereby preclude the formation of significant quantities of unwanted, less controllable sub-oxide films. Thermodynamic forces will drive the oxide compositions to their most stable, fully oxidized state, e.g., $Nb_2O_5$, $Ta_2O_5$, etc. As noted above, it will still be necessary to crystallize these duplex oxide layers. Such treatments can be done by RTP and will be shorter than those used on MOCVD and sputter-deposited oxides since the stoichiometry and purity of the "low temperature oxides" need not be adjusted at high temperature.

Although perhaps obvious to those skilled in the art, one can sketch out a few useful fabrication guides:

(i) Thinner TM layers will be used in this invention relative to those used to form DRAMs. Unlike DRAMs where leakage must be eliminated, the duplex oxides used here must be thin enough to carry very controlled levels of current flow when subjected to reasonable applied fields and times.

(ii) The TM and their oxides are highly refractory and etchable (e.g., by RIE). Hence they are quite compatible with poly-Si control gate processes and other subsequent steps.

(iii) TM silicide formation will not occur during the oxidation step. It could take place at a significant rate at the temperatures used to deposit the poly-Si control gate. If so, several solutions can be applied including:
(i) Insert certain metals at the TM/poly-Si boundaries that will prevent inter-diffusion of the TM and the poly-Si.
(ii) Completely oxide the TMs. The electrical characteristics of the resulting poly-Si/TM oxide 1/TM oxide 2/poly-Si structure will be different in the absence of having TM at the oxide/metal interfaces.

Insulator and contact metal layer combinations, e.g. platinum (Pt) and aluminum (Al) with appropriate barrier heights, according to the teachings of the present invention, have been circled in FIG. 9. Also, as described above, the transition metal oxide interpoly insulators can be formed having a thickness of less than 20 Angstroms such that the tunnel barrier is less than 1.5 eV as required by the present invention.

EXAMPLE III

Formation of Alternate Metal Compound Tunnel Barriers

Although no applications may be immediately obvious, it is conceivable that one might want to form a stack of oxide films having quite different properties, for example, a stack comprised of a high dielectric constant (k) oxide/a low k oxide/a high k oxide. "Low temperature oxidation" can be used to form numerous variations of such structures. While most of this disclosure deals with the formation and use of stacks of oxide dielectrics, it is also possible to use "low temperature oxidation" to form other thin film dielectrics such as nitrides, oxynitrides, etc. that could provide additional functions such as being altered by monochromatic light, etc. These will not be discussed further here.

EXAMPLE IV

Formation of Perovskite Oxide Tunnel Barriers

Oxide tunnel barriers having a wide range of properties can also be grown via oxidation of alloy films of appropriate compositions. Thin film barriers of platinum, palladium and similar noble metals must be added to prevent inter-diffusion and degradation of the perovskite oxides with the poly-Si layers. Some processing remarks are stated below.

For example, results have been obtained which demonstrate that at least a limited range of high temperature, super-conducting oxide films can be made by thermally oxidizing Y—Ba—Cu alloy films. "Low temperature oxidation" and short thermal treatments in an inert ambient at 700 C in order to form a range of perovskite oxide films from parent alloy films have also been employed. The dielectric constants of crystallized, perovskite oxides can be very large, with values in the 100 to 1000 or more range. The basic process is more complicated than that needed to oxidize layered films of transition metals. (See Example II.) The TM layers would typically be pure metals although they could be alloyed. The TMs are similar metallurgically as are their oxides. In contrast, the parent alloy films that can be converted to a perovskite oxide are typically comprised of metals having widely different chemical reactivities with oxygen and other common gasses. In the Y—Ba—Cu system referenced above, Y and Ba are among the most reactive of metals while the reactivity of Cu approaches (albeit distantly) those of other noble metals. If the alloy is to be completely oxidized, then thin film barriers such as Pd, Pt, etc. or their conductive oxides must be added between the Si and the parent metal film to serve as: electrical contact layers; diffusion barriers; and, oxidation stops. In such a case, the Schottky barrier heights of various TM oxides and perovskite oxides in contact with various metals will help in the design of the tunnel device. In the more likely event that the perovskite parent alloy film will be only partially converted to oxide and then covered with a second layer of the parent alloy (recall the structure of FIG. 2), then the barrier heights will represent that developed during oxide growth at the parent perovskite alloy/perovskite oxide interface. Obviously, such barrier heights cannot be predicted ab initio for such a wide class of materials but will have to be developed as the need arises. This information will have to be developed on a system-by-system basis.

System Level

FIG. 9 illustrates a block diagram of an embodiment of an electronic system 901 according to the teachings of the present invention. In the embodiment shown in FIG. 9, the system 901 includes a memory device 900 which has an array of memory cells 902, address decoder 904, row access circuitry 906, column access circuitry 908, control circuitry 910, and input/output circuit 912. Also, as shown in FIG. 9, the circuit 901 includes a processor 914, or memory controller for memory accessing. The memory device 900 receives control signals from the processor 914, such as WE*, RAS* and CAS* signals over wiring or metallization lines. The memory device 900 is used to store data which is accessed via I/O lines. It will be appreciated by those skilled in the art that additional circuitry and control signals can be provided, and that the memory device 900 has been simplified to help focus on the invention. At least one of the memory cells 902 has a memory cell formed according to the embodiments of the present invention. That is, at least one memory cell includes a low tunnel barrier interpoly insulator according to the teachings of the present invention.

It will be understood that the embodiment shown in FIG. 9 illustrates an embodiment for electronic system circuitry in which the novel memory cells of the present invention are used. The illustration of system 901, as shown in FIG. 9, is intended to provide a general understanding of one application for the structure and circuitry of the present invention, and is not intended to serve as a complete description of all the elements and features of an electronic system using the novel memory cell structures. Further, the invention is equally applicable to any size and type of memory device 901 using the novel memory cells of the present invention and is not intended to be limited to that described above. As one of ordinary skill in the art will understand, such an electronic system can be fabricated in single-package processing units, or even on a single semiconductor chip, in order to reduce the communication time between the processor and the memory device.

Applications containing the novel memory cell of the present invention as described in this disclosure include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

Method of Operation

Write can be achieved by tunneling from the control gate by driving the control gate negative and/or channel hot electron injection as in flash memory devices. Erase would be accomplished by driving the control gates with a relatively large positive voltage and tunneling from the metal on top of the floating gate to the metal on the bottom of the control gate. Read is accomplished by driving the control gate with a smaller positive voltage, if no electrons are stored on the floating gate the transistor will turn on. If electrons are stored on the floating gate the transistor will not turn on or only turn on at a lower conductivity state, this constitutes the memory function.

During a read operation the control gate is driven with the same positive polarity voltage that is used for erase. A low tunnel barrier between the floating gate and the control gate will make the erase operation easy but will also result in some finite leakage current at the lower positive control gate voltage during read. If as in DRAMs a retention time of one second is required then the leakage current at the read voltage must be small. If the gate oxide is 2 nm (20 Å) thick then the capacitance is about $1.6 \times 10^{-6}$ F/cm$^2$ and a 1 Volt difference will store a charge of $1.6 \times 10^{-6}$ Coulombs/cm$^2$. A retention time of one second requires a leakage current of less than about $10^{-6}$ Amps/cm$^2$; as shown in FIG. 7C if the tunneling barrier is 1.25 eV and the electric field in the low barrier interpoly/intergate insulator is less than about $1.5 \times 10^6$ V/cm then this will be achieved. On the other hand, if during erase the electric field in the interpoly/intergate insulator is over $2.5 \times 10^6$ V/cm then the erase current will be over 1 Amp/cm$^2$ and erase will be easily achieved in less than a microsecond. The lower tunneling barrier, 1.25 eV, results in a much faster erase at much lower electric fields and than in conventional flash memory devices which require fields of $10^7$ V/cm to achieve the same erase current of 1 Amp/cm$^2$ with a silicon oxide tunnel barrier of 3.2 eV.

The high electric fields in conventional flash memory devices result in premature insulator failures and reliability failures since these electric fields are very close to the dielectric strength of the silicon oxide gate insulators. Here the tunnel barriers are very low in the order of 0.6 to 1.5 eV, while this makes the erase very easy on the other hand the finite leakage currents require that these memory devices be refreshed, in other words they emulate DRAMs.

CONCLUSIONS

Low barrier tunnel insulators are described between the floating gate and control gate in a flash memory type devices to form DEAPROM cells which require refresh. These low barrier insulators, 1.5–0.6 eV, are easily fabricated by the oxidation of a transition metal or a composite metal layer. The devices work on a dynamic basis and must be refreshed, in this respect they emulate DRAM's. While the amount of charge stored on the floating gate is small the transistor provides gain and charge multiplication resulting in a large output signal and ease of reading the stored data. If there is an adverse capacitance ratio due to a large difference of dielectric constants then the vertical gate structures described previously can be employed.

Write can be achieved by the normal channel hot electron injection and gate current through the silicon oxide to the floating gate. This is done by selecting a particular column by applying a high control gate voltage and applying relatively large drain voltage as is done with conventional ETOX memory devices. However, according to the teachings of the present invention, write can also be accomplished by applying a positive voltage to the substrate or well select line and a large negative voltage to the control gates, electrons will tunnel from the control gate to the floating gate. The low tunnel barrier will provide an easy write operation and the selection of the substrate or well bias will provide selectivity and address only one device.

According to the teachings of the present invention, erase is achieved by providing a negative voltage to the substrate or well address line and a large positive voltage to the control gate. This causes electrons to tunnel off of the floating gate on to the control gate. A whole row can be erased by addressing all the column lines along that row and a block can be erased by addressing multiple row back gate or substrate/well address lines.

Read is accomplished as in conventional ETOX memory devices. A column line is addressed by applying a positive control gate voltage and sensing the current along the data bit or drain row address line.

The above structures and fabrication methods have been described, by way of example, and not by way of limitation, with respect to DEAPROM memory with low tunnel barrier interpoly insulators.

It has been shown that the low tunnel barrier interpoly insulators of the present invention avoid the large barriers to electron tunneling or hot electron injection presented by the silicon oxide-silicon interface, 3.2 eV, which result in slow write and erase speeds even at very high electric fields. The present invention also avoids the combination of very high electric fields and damage by hot electron collisions in the which oxide result in a number of operational problems like soft erase error, reliability problems of premature oxide breakdown and a limited number of cycles of write and erase. Further, the low tunnel barrier interplay dielectric insulator erase approach, of the present invention remedies the above mentioned problems of having a rough top surface on the polysilicon floating gate which results in, poor quality interpoly oxides, sharp points, localized high electric fields, premature breakdown and reliability problems.

DOCUMENTS

Application Ser. No. 09/945,507, L. Forbes and J. M. Elderidge, "FLASH MEMORY DEVICES WITH METAL OXIDE INTERPLOY INSULATORS," filed Aug. 30, 2001;

Application Ser. No. 08/902,843, "DEAPROM (Dynamically Electrically Alterable Programmable Read Only Memory) UTILIZING INSULATING AND AMORPOHOUS SILICON CARBIDE GATE INSULATOR," filed Jul. 29, 1997;

S. R. Pollack and C. E. Morris, "Tunneling through gaseous oxidized films of AL2O3," Trans. AIME, Vol. 233, p. 497, 1965;

Y. Shi et al., "Tunneling leakage current in ultrathin (<4 nm) nitride/oxide stack dielectrics," IEEE Electron Device Letters, Vol. 19, No. 10, pp. 388–390, 1998;

U.S. Pat. No. 6,135,175, "Memory Address Decode Array with vertical transistors;"

U.S. Pat. No. 5,691,230, "Technique for Producing Small Islands of Silicon on Insulator;"

U.S. Pat. No. 6,424,001, "Flash Memory with Ultrathin Vertical Body Transistors;"

O. Kubaschewski and B. E. Hopkins, "Oxidation of Metals and Alloys," Butterworth, London, pp/53–64, 1962;

S. M. Sze, "Physics of Semiconductor Devices," Wiley, NY, pp. 553–556, 1981;

G. Simmons and A. El-Badry, "Generalized formula for the electric tunnel effect between similar electrodes separated by a thin insulating film," J. Appl. Phys., Vol. 34, p. 1793, 1963;

Z. Hurych, "Influence of nonuniform thickness on dielectric layers on capacitance and tunnel currents," Solid-State Electronics, Vol. 9, p. 967, 1966;

S. P. S. Arya and H. P. Singh, "Conduction properties of thin Al2O3 films," Thin Solid Films, Vol. 91, No. 4, pp. 363–374, May 1982;

K.-H. Gundlach and J. Holzl, "Logarithmic conductivity of Al—Al2O3-AL tunneling junctions produced by plasma- and by thermal-oxidation," Surface Science, Vol. 27, pp. 125–141, 1971;

J. M. Grimblot and J. M. Eldridge, "I. Interaction of Al films with O2 at low pressures," J. Elect. Chem. Soc., Vol. 129, No. 10, pp. 2366–2368, 1982;

J. Grimblot and J. M. Eldridge, "II. Oxidation of Al films," J. Elect. Chem. Soc., Vol. 129, No. 10, pp. 2369–2372, 1982;

J. H. Greiner, "Oxidation of lead films by rf sputter etching in an oxygen plasma," J. Appl. Phys., vol. 45, No. 1, pp. 32–37, 1974;

R. G. Marchalek et al., "Photoresponse characteristics of thin-filmed nickel-nickel oxide-nickel tunnel junctions," IEEE Journal of Quantum Electronics, Vol. QT-1, No. 4, pp. 743–754, April 1983;

L. Eierdal et al., "Interaction of oxygen with Ni(110) studied by scanning tunneling Microscopy," Surface Science, Vol. 312, No. 1-2, pp. 31–53, Jun. 1, 1994;

H. Itokawa et al., "Determination of bandgap and energy band alignment for high-dielectric-constant gate insulators using high-resolution x-ray photoelectron spectroscopy," Ext. Abstracts Int. Conf. On Solid State Devices and Materials, pp. 158–159, 1999;

H. F. Luan et al., "High Quality Ta2O5 gate dielectrics with $T_{ox, eq}$<10 Å," International Electron Devices Meeting Technical digest, pp. 141–144, 1999;

J. Robertson and C. W. Chen, "Schottky barrier heights of tantalum oxide, barium strontium titanate, lead titanate, and strontium bismuth tantalite," Appl. Phys. Lett., Vol. 74, No. 8, pp. 1168–1170, Feb. 22, 1999;

J. Robertson, "Band offsets of wide-band gap oxides and implications for future electronic devices," J. Vac. Sci. Technol., Vol. B 18, No. 3, pp. 1785–1794, May–June 2000;

X. Guo et al., "High Quality ultra-thin (1.5 nm) TiO2/Si3N4 gate dielectric for deep submicron CMOS technology," International Electron Devices Meeting Technical Digest, pp. 137–140, 1999;

H. Kim et al., "Leakage current and electrical breakdown in metal-organic chemical vapor deposited TiO2 dielectrics on silicon substrates," Vol. 69, No. 25, pp. 3860–3862, Dec. 16, 1996;

J. Yan et al., "Structure and electrical characterization of TiO2 grown from titanium tetrakis-isoproxide (TTIP) and TTIP/H2O ambient," J. Vac. Sci. Technol., Vol. B 14, No. 3, pp. 1706–1711, 1996;

W. Qi et al., "MOSCAP and MOSFET characteristics using ZrO2 gate dielectric deposited directly on Si," Technical Digest of 1999 IEDM, pp. 145–148;

Y. Ma et al., "Zirconium Oxide Band Gate Dielectrics with Equivalent Oxide and Thickness of Less Than 1.0 nm and Performance of Sub-micron MOSFET using a Nitride Gate Replacement Process," Digest of 1999 IEDM, pp. 149–152

Afanas et al., "Electron energy barriers between (100) Si and ultrathin stacks of SiO2, AL2O3, and ZrO2 insulators," Appl. Phys. Lett., Vol. 78, No. 20, pp. 3073–3075, 2001;

K. Kukli et al., "Development of dielectric properties of niobium oxide, tantalum oxide, and aluminum oxide based nanolayered materials," J. Electro. Chem. Soc., Vol. 148, No. 2, pp. F35–F41, 2001;

J. Kwo et al., "Properties of high k gate dielectrics Gd2O3 and Y2O for Si," J. Appl. Phys., Vol. 89, No. 7, pp. 3920–3927, 2001;

J. M. Greiner, "Josephson tunneling barriers by rf sputter etching in an oxygen plasma," J. Appl. Phys., Vol. 42, No. 12, pp. 5151–5155, 1971;

U.S. Pat. No. 4,412,902, "Method of fabrication of Josephson tunnel junctions;"

U.S. Pat. No. 6,461,931, "Thin dielectric films for DRAM storage capacitors"; and U.S. Pat. No. 5,350,738, "Method of manufacturing an oxide superconducting film."

The above documents are incorporated by reference for any purpose.

What is claimed is:

1. A floating gate transistor, comprising:
a first source/drain region and a second source/drain region separated by a channel region in a substrate;
a floating gate opposing the channel region and separated therefrom by a gate oxide;
a control gate opposing the floating gate;
wherein the control gate is separated from the floating gate by a low tunnel barrier intergate insulator having a thickness of less than 20 Angstroms;
wherein the floating gate includes a polysilicon floating gate having a metal layer formed thereon in contact with the low tunnel barrier intergate insulator; and
wherein the control gate includes a polysilicon control gate having a metal layer formed thereon in contact with the low tunnel barrier intergate insulator.

2. The floating gate transistor of claim 1, wherein the low tunnel barrier intergate insulator includes a metal oxide insulator selected from the group consisting of nickel oxide (NiO), and aluminum oxide ($Al_2O_3$).

3. The floating gate transistor of claim 1, wherein the low tunnel barrier intergate insulator includes a transition metal oxide.

4. The floating gate transistor of claim 3, wherein the transition metal oxide is selected from the group consisting of $Ta_2O_5$, $TiO_2$, $ZrO_2$, $Nb_2O_5$, $Y_2O_3$, and $Gd_2O_3$.

5. The floating gate transistor of claim 1, wherein the low tunnel barrier intergate insulator includes a Perovskite oxide tunnel barrier.

6. The floating gate transistor of claim 5, wherein the Perovskite oxide tunnel barrier is selected from the group consisting of $SrBi_2Ta_2O_3$, $SrTiO_3$, $PbTiO_3$, and $PbZrO_3$.

7. The floating gate transistor of claim 1, wherein the floating gate transistor includes an n-channel type floating gate transistor.

8. A vertical memory cell, comprising:
a first source/drain region formed on a substrate;
a body region including a channel region formed on the first source/drain region;
a second source/drain region formed on the body region;
a floating gate opposing the channel region and separated therefrom by a gate oxide;

a control gate opposing the floating gate;
wherein the control gate is separated from the floating gate by a low tunnel barrier intergate insulator having a thickness of less than 20 Angstroms;
wherein the floating gate includes a polysilicon floating gate having a metal layer formed thereon in contact with the low tunnel barrier intergate insulator; and
wherein the control gate includes a polysilicon control gate having a metal layer formed thereon in contact with the low tunnel barrier intergate insulator.

9. The vertical memory cell of claim 8, wherein the low tunnel barrier intergate insulator includes an insulator selected from the group consisting of NiO, $Al_2O_3$, $Ta_2O_5$, $TiO_2$, $ZrO_2$, $Nb_2O_5$, $Y_2O_3$, $Gd_2O_3$, $SrBi_2Ta_2O_3$, $SrTiO_3$, $PbTiO_3$, and $PbZrO_3$.

10. The vertical memory cell of claim 8, wherein the floating gate includes a vertical floating gate formed alongside of the body region.

11. The vertical memory cell of claim 10, wherein the control gate includes a vertical control gate formed alongside of the vertical floating gate.

12. The vertical memory cell of claim 8, wherein the floating gate includes a horizontally oriented floating gate formed alongside of the body region.

13. The vertical memory cell of claim 12, wherein the control gate includes a horizontally oriented control gate formed above the horizontally oriented floating gate.

14. A DEAPROM memory cell, comprising:
a first source/drain region and a second source/drain region separated by a channel region in a substrate;
a polysilicon floating gate opposing the channel region and separated therefrom by a gate oxide;
a first metal layer formed on the polysilicon floating gate;
a metal oxide intergate insulator formed on the metal layer, wherein the metal oxide intergate insulator has a tunnel barrier of less than 1.5 eV;
a second metal layer formed on the metal oxide intergate insulator; and
a polysilicon control gate formed on the second metal layer.

15. The DEAPROM memory cell of claim 14, wherein first and the second metal layers are platinum (Pt) and the metal oxide intergate insulator is selected from the group consisting of $TiO_2$, $SrTiO_3$, $PbTiO_3$, and $PbZrO_3$.

16. The DEAPROM memory cell of claim 14, wherein the first and second metal layer are aluminum and the metal oxide intergate insulator is selected from the group consisting of $Ta_2O_5$, $ZrO_2$, $SrBi_2Ta_2O_3$, $SrTiO_3$, $PbTiO_3$, and $PbZrO_3$.

17. The DEAPROM memory cell of claim 14, wherein the metal oxide intergate insulator has a thickness of less than 20 Angstroms, and wherein the metal oxide intergate insulator is selected from the group consisting of NiO, $Al_2O_3$, $Ta_2O_5$, $TiO_2$, $ZrO_2$, $Nb_2O_5$, $Y_2O_3$, $Gd_2O_3$, $SrBi_2Ta_2O_3$, $SrTiO_3$, $PbTiO_3$, and $PbZrO_3$.

18. The DEAPROM memory cell of claim 14, wherein the first and the second metal layers are selected from the group consisting of platinum (Pt) and aluminum (Al), and wherein the metal oxide intergate insulator is selected from the group consisting of transition metal oxides and Perovskite oxides.

19. The DEAPROM memory cell of claim 14, wherein the DEAPROM memory cell includes a vertical DEAPROM memory cell.

20. A method of forming a floating gate transistor, comprising:
forming a first source/drain region and a second source/drain region separated by a channel region in a substrate;
forming a floating ate opposing the channel region and separated therefrom by a gate oxide;
forming a control gate opposing the floating gate; and
forming a low tunnel barrier integrate insulator to separate the control gate from the floating gate, wherein forming the low tunnel barrier intergate insulator includes a tunnel barrier of less than 1.5 eV;
wherein forming the floating gate includes forming a polysilicon floating gate having a metal layer formed thereon in contact with the low tunnel barrier intergate insulator; and
wherein forming the control gate includes a polysilicon control gate having a metal layer formed thereon in contact with the low tunnel barrier intergate insulator.

21. The method of claim 20, wherein forming the low tunnel barrier intergate insulator includes forming a metal oxide insulator selected from the group consisting of NiO, $Al_2O_3$, $Ta_2O_5$, $TiO_2$, $ZrO_2$, $Nb_2O_5$, $Y_2O_3$, $Gd_2O_3$, $SrBi_2Ta_2O_3$, $SrTiO_3$, $PbTiO_3$, and $PbZrO_3$.

22. The method of claim 20, wherein forming the low tunnel barrier intergate insulator includes forming a low tunnel barrier intergate insulator having a thickness of less than 20 Angstroms.

23. The method of claim 20, wherein forming the floating gate includes the metal layer being selected from the group consisting of platinum (Pt) and aluminum (Al).

24. The method of claim 20, wherein forming the control gate includes the metal layer being selected from the group consisting of platinum (Pt) and aluminum (Al).

25. A method for operating a DEAPROM memory cell, comprising:
writing to a floating gate of the DEAPROM memory cell using channel hot electron injection, wherein the DEAPROM memory cell includes:
a first source/drain region and a second source/drain region separated by a channel region in a substrate;
a floating gate opposing the channel region and separated therefrom by a gate oxide;
a control gate opposing the floating gate;
wherein the control gate is separated from the floating gate by a low tunnel barrier intergate insulator having a tunnel barrier of less than 1.5 eV,
wherein the floating gate includes a polysilicon floating gate having a metal layer formed thereon in contact with the low tunnel barrier intergate insulator, and
wherein the control gate includes a polysilicon control gate having a metal layer formed thereon in contact with the low tunnel barrier intergate insulator; and
erasing charges from the floating gate by tunneling electrons off of the floating ate and onto the control gate by applying an electric field across the intergate insulator of $2.5 \times 10^6$ V/cm.

26. The method of claim 25, wherein writing to a floating gate of the DEAPROM memory cell includes storing a charge of $1.6 \times 10^{-6}$ coulombs/$cm^2$ on the floating gate.

27. The method of claim 26, wherein the method further includes refreshing a stored charge on the floating gate at 1.0 second intervals.

28. The method of claim 25, wherein erasing charge from the floating gate by tunneling electrons off of the floating gate and onto the control gate further includes:

providing a negative voltage to the substrate; and providing a large positive voltage to the control gate such that an erase current of 1 Amp/cm² is created between the floating gate and the control gate, and wherein an erase of charge from the floating gate is achieved in less than 1.0 microseconds.

29. The method of claim 25, wherein the method further includes writing to the floating gate by tunneling electrons from the control gate to the floating gate.

30. The method of claim 29, wherein writing to the floating gate by tunneling electrons from the control gate to the floating gate further includes:

applying a positive voltage to the substrate; and applying a large negative voltage to the control gate.

31. A method for operating an array of DEAPROM memory cells, comprising:

writing to one or more floating gates of a number of DEAPROM memory cells in the array of DEAPROM memory cells by tunneling electrons from a control gate through a low tunnel barrier intergate insulator having a tunnel barrier of less than 1.5 eV to a floating gate, wherein the array of DEAPROM memory cells includes:

a number of pillars extending outwardly from a substrate, wherein each pillar includes a first source/drain region, a body region, and a second source/drain region;

a number of floating gates opposing the body regions in the number of pillars and separated therefrom by a gate oxide;

a number of control gates opposing the floating gates;

a number of buried source lines disposed below the number of pillars and coupled to the first source/drain regions along a first selected direction in the array of memory cells;

a number of control gate lines formed integrally with the number of control gates along a second selected direction in the array of DEAPROM memory cells, wherein the number of control gates lines are separated from the floating gates by a low tunnel barrier intergate insulator;

a number of bitlines coupled to the second source/drain regions along a third selected direction in the array of DEAPROM cells, wherein each the floating gates includes a polysilicon floating gate having a metal formed thereon in contact with the low tunnel barrier intergate insulator, and wherein each the control gate includes a polysilicon control gate having a metal layer formed thereon in contact with the low tunnel barrier intergate insulator; and erasing charges from the one or more floating gates by tunneling electrons off of the one or more floating gates and onto the number of control gates through the low tunnel barrier intergate insulator.

32. The method of claim 31, wherein tunneling electrons through a low barrier intergate insulator includes tunneling electrons between one or more floating gates and control gates in the array through an intergate insulator selected from the group consisting of NiO, $Al_2O_3$, $Ta_2O_5$, $TiO_2$, $ZrO_2$, $Nb_2O_5$, $Y_2O_3$, $Gd_2O_3$, $SrBi_2Ta_2O_9$, $SrTiO_3$, $PbTiO_3$, and $PbZrO_3$.

33. The method of claim 31, wherein tunneling electrons through a low barrier intergate insulator includes tunneling electrons between a metal layer formed on the floating gate in contact with the low tunnel barrier intergate insulator and a metal layer formed on the control gate and also in contact with the low tunnel barrier intergate insulator, wherein the metal layers are selected from the group consisting of platinum (Pt) and aluminum (Al).

34. The method of claim 31, wherein erasing charge from the one or more floating gates by tunneling electrons off of the floating gate and onto the number of control gates further includes:

providing a negative voltage to a substrate of one or more DEAPROM memory cells; and providing a large positive voltage to the control gate for the one or more DEAPROM memory cells.

35. The method of claim 34, wherein the method further includes erasing an entire row of DEAPROM memory cells by providing a negative voltage to all of the substrates along an entire row of DEAPROM memory cells and providing a large positive voltage to all of the control gates along the entire row of DEAPROM memory cells.

36. The method of claim 34, wherein the method further includes erasing an entire block of DEAPROM memory cells by providing a negative voltage to all of the substrates along multiple rows of DEAPROM memory cells and providing a large positive voltage to all of the control gates along the multiple rows of DEAPROM memory cells.

37. The vertical memory cell of claim 8, wherein the control gate has a tunnel barrier of less than 1.5 eV.

38. The vertical memory cell of claim 8, wherein the control gate is adapted for a Dynamic Electrically Alterable Programmable Read Only Memory.

* * * * *

UNITED STATES PATENT AND TRADEMARK OFFICE
CERTIFICATE OF CORRECTION

| | |
|---|---|
| PATENT NO. | : 7,027,328 B2 |
| APPLICATION NO. | : 10/789038 |
| DATED | : April 11, 2006 |
| INVENTOR(S) | : Forbes et al. |

It is certified that error appears in the above-identified patent and that said Letters Patent is hereby corrected as shown below:

On the face page, in field (56), under "U.S. Patent Documents", in Column 1, line 1, delete "357/45" and insert -- 357/54 --, therefor.

On the face page, in field (56), under "U.S. Patent Documents", in column 2, line 1, delete "437/229" and insert --437/29 --, therefor.

On the face page, in field (56), under "U.S. Patent Documents", in column 2, line 4, delete "438/48" and insert -- 437/48 --, therefor.

On page 2, in field (56), under "U.S. Patent Documents", in column 1, line 39, delete "267/310" and insert -- 257/310 --, therefor.

On page 2, in field (56), under "Other Publications", in column 2, line 5, delete "SiO2," and insert -- $S1O_2$, --, therefor.

On page 2, in field (56), under "Other Publications", in column 2, line 5, delete "Al2O3," and insert -- $Al_2O_3$, --, therefor.

On page 2, in field (56), under "Other Publications", in column 2, line 5, delete "adn" and insert -- and --, therefor.

On page 2, in field (56), under "Other Publications", in column 2, line 5, delete "ZrO3" and insert -- $ZrO_3$ --, therefor.

On page 2, in field (56) under "Other Publications", in column 2, line 6, delete "ZrO2" and insert -- $ZrO_2$ --, therefor.

On page 2, in field (56), under "Other Publications", in column 2, line 13, delete "tunnelign" and insert -- tunneling --, therefor.

On page 2, in field (56), under "Other Publications", in column 2, line 27, delete "Plasms" and insert -- Plasma --, therefor.

On page 2, in field (56), under "Other Publications", in column 2, line 30, delete "plasms" and insert -- plasma --, therefor.

On page 3, in field (56), under "Other Publications", in column 2, line 47, delete "Nanoaminates" and insert -- Nanolaminates --, therefor.

UNITED STATES PATENT AND TRADEMARK OFFICE
CERTIFICATE OF CORRECTION

| | |
|---|---|
| PATENT NO. | : 7,027,328 B2 |
| APPLICATION NO. | : 10/789038 |
| DATED | : April 11, 2006 |
| INVENTOR(S) | : Forbes et al. |

It is certified that error appears in the above-identified patent and that said Letters Patent is hereby corrected as shown below:

On page 3, in field (56), under "Other Publications", in column 2, line 48, delete "2000" and insert -- 2001 --, therefor.

In column 7, line 29, delete "nickle" arid insert -- nickel --, therefor.

In column 20, line 38, delete "interplay" and insert -- interploy --, therefor.

In column 21, line 30, delete "QT-1," and insert -- QE-1, --, therefor.

In column 24, line 6, in Claim 20, delete "ate" and insert -- gate --, therefor.

In column 24, line 9, in Claim 20, delete "integrate" and Insert -- intergate --, therefor.

In column 24, line 45, in Claim 25, after "gate;" insert -- and --.

In column 24, line 55, in Claim 25, delete "charges" and insert -- charge --, therefor.

In column 24, line 56, in Claim 25, delete "ate" and insert -- gate --, therefor.

In column 25, line 17, in Claim 31, after "gates" delete "of" and insert -- for --, therefor.

In column 25, line 45, in Claim 31, after "wherein" delete "each".

In column 25, line 45, in Claim 31, delete "gates" and insert -- gate --, therefor.

In column 25, line 46, in Claim 31, after "metal" insert -- layer --.

In column 25, line 47, in Claim 31, delete "insulator," and insert -- insulator; --, therefor.

In column 25, line 49, in Claim 31, after "wherein" delete "each".

UNITED STATES PATENT AND TRADEMARK OFFICE
CERTIFICATE OF CORRECTION

PATENT NO. : 7,027,328 B2  Page 3 of 3
APPLICATION NO. : 10/789038
DATED : April 11, 2006
INVENTOR(S) : Forbes et al.

It is certified that error appears in the above-identified patent and that said Letters Patent is hereby corrected as shown below:

In column 26, line 1, in Claim 31, delete "charges" and insert -- charge --, therefor.

Signed and Sealed this

Fourteenth Day of November, 2006

JON W. DUDAS
*Director of the United States Patent and Trademark Office*